United States Patent [19]

Schmidt

[11] Patent Number: 4,493,081
[45] Date of Patent: Jan. 8, 1985

[54] DYNAMIC MEMORY WITH ERROR CORRECTION ON REFRESH

[75] Inventor: Frederick W. Schmidt, Mission Viejo, Calif.

[73] Assignee: Computer Automation, Inc., Irvine, Calif.

[21] Appl. No.: 569,924

[22] Filed: Jan. 11, 1984

Related U.S. Application Data

[63] Continuation of Ser. No. 277,614, Jun. 26, 1981, abandoned.

[51] Int. Cl.³ .............................................. G06F 11/10
[52] U.S. Cl. ......................................... 371/38; 371/13
[58] Field of Search ............... 371/38, 13, 5; 365/201, 365/222

[56] References Cited

U.S. PATENT DOCUMENTS

| | | | |
|---|---|---|---|
| 3,906,200 | 9/1975 | Petschaver | 371/5 |
| 3,999,051 | 12/1976 | Petschaver | 371/5 |
| 4,069,970 | 1/1978 | Buzzard et al. | 371/5 |
| 4,209,846 | 6/1980 | Seppa | 371/5 |
| 4,216,541 | 8/1980 | Clover et al. | 371/5 |
| 4,255,808 | 3/1981 | Schaber | 371/38 |
| 4,319,356 | 3/1982 | Kocol et al. | 371/38 |
| 4,328,581 | 5/1982 | Harmon et al. | 371/5 |
| 4,334,309 | 9/1982 | Bannon et al. | 371/38 |
| 4,369,510 | 1/1983 | Johnson et al. | 371/38 |
| 4,380,812 | 4/1983 | Ziegler et al. | 371/38 |

OTHER PUBLICATIONS

Barsuhn et al., "Avoidance of Soft Fail Accumulation", *IBM Tech. Disclosure Bulletin*, vol. 20, No. 8, Jan. 1978, pp. 3187–3188.

McLeod "Attacks Mount on Alpha Particles as RAM Densities Rise", *Electronic Design*, Nov. 22, 1980, pp. 36–37.

Austin et al., "Error Frequency Warning Detector on Storage with ECC", *IBM Tech. Disclosure Bulletin*, vol. 12, No. 6, Nov. 1969, p. 895.

*Primary Examiner*—David H. Malzahn
*Attorney, Agent, or Firm*—Knobbe, Martens, Olson and Bear

[57] ABSTRACT

An apparatus is disclosed for error correcting during the refresh cycle of a dynamic memory. The apparatus includes a refresh counter means for supplying row addresses to a dynamic memory during refresh cycles and decoder circuitry for supplying row address and column address strobe signals to the memory to cause it to refresh rows sequentially and pick one word out of each refreshed row for error correcting.

Also disclosed is a computer system utilizing a semiconductor memory with on-board error correcting circuitry using hamming codes to generate check bits from which they are generated. Upon access of data from the memory, the check bits are used to locate and correct single bit errors and detect some double bit errors. A CPU is disclosed which incorporates a spot check system stored in non-volatile memory to independently randomly generate syndrome bits from data accessed from memory and compare these syndrome bits to the check bits stored with the accessed data. The CPU is stopped if the syndrome bits and check bits so compared are not identical.

12 Claims, 8 Drawing Figures

COMPUTER SYSTEM

```
        Do 1 2 3 4 5 6 7 8 9 10 11 12 13 14 15    Co 1 2 3 4
    S1     0 0 0 0 1 1 1 1 1 1 0 0 0 1 1        1 0 0 0 0
    S2     0 1 1 1 0 0 0 1 1 1 0 0 1 0 1        0 1 0 0 0
    S3     1 0 1 1 0 1 1 0 0 1 1 0 1 0 1 0      0 0 1 0 0
    S4     1 1 0 1 1 0 1 0 1 0 1 1 0 1 0 0      0 0 0 1 0
    S5     1 1 1 0 1 1 0 1 0 0 1 1 1 0 0 0      0 0 0 0 1
```

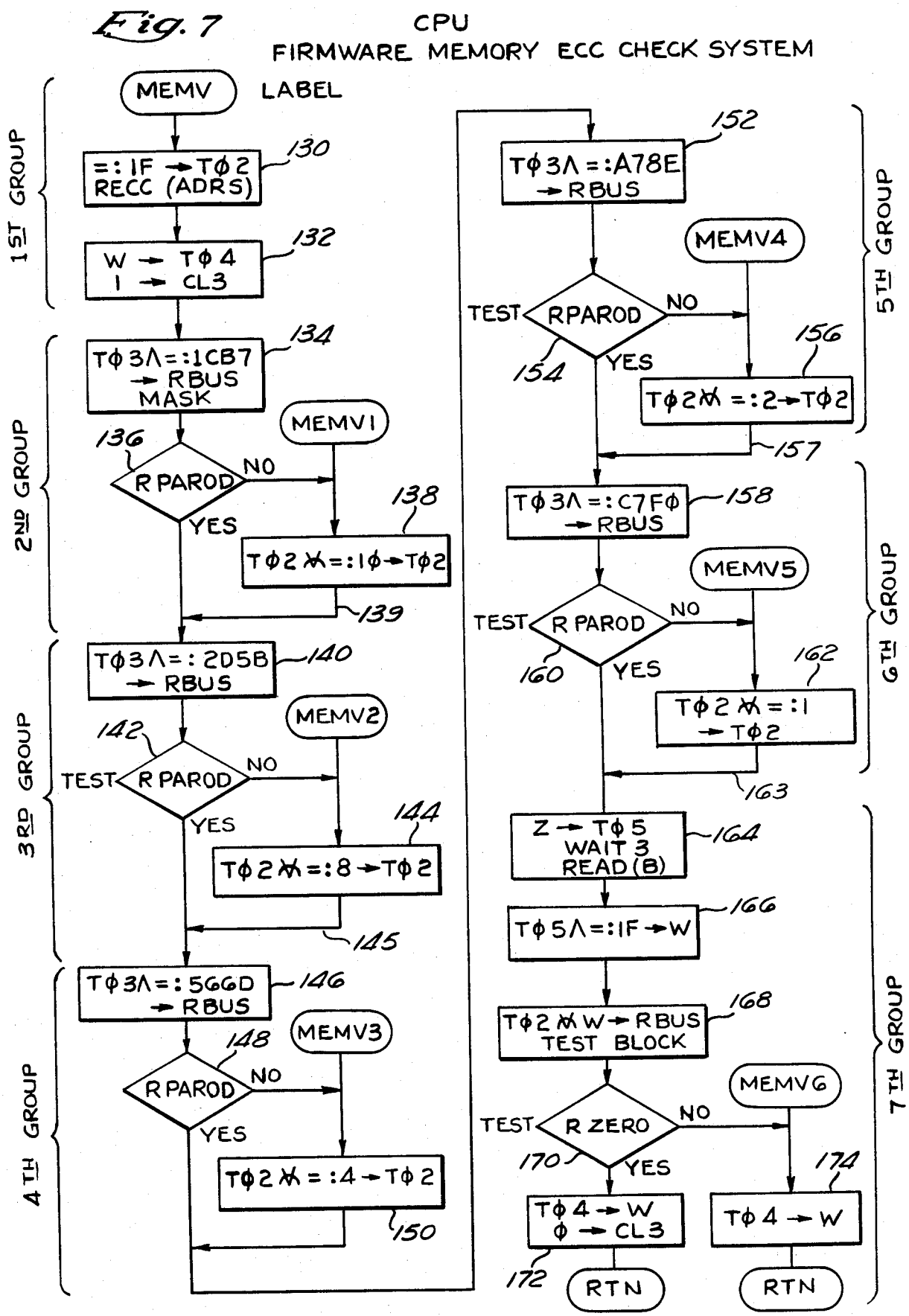
Fig. 7 CPU FIRMWARE MEMORY ECC CHECK SYSTEM

DYNAMIC MEMORY WITH ERROR CORRECTION ON REFRESH

This application is a continuation of application Ser. No. 277,614, filed 6/26/81 now abandoned.

BACKGROUND OF THE INVENTION

The evolving technology in the design of computer system memories has tended to render magnetic core memories obsolete. In their stead, many modern computer systems utilize high density semi-conductor memory utilizing integrated circuit chips with each chip containing thousands of individual memory cells, each holding one bit of data. Each memory cell is composed of one or more transistors and associated components depending upon whether the memory cell is static or dynamic.

The cost per bit of storage of data in computer memory systems is a major component of the total cost of the computer system. Because modern application programs and operating systems are composed of millions of alphanumeric characters, and because each character must be represented by a multi-bit magnetic code, millions upon millions of binary bits must be stored.

The economics of integrated circuit manufacture are such that miniaturization leads to increasing cost effectiveness of the chip. That is, if more circuits can be put on one silicon wafer within one package, the chip will have relatively more functionality for roughly the same cost. The silicon wafers themselves cannot be made larger than a certain maximum size, because the silicon wafer has to be a single crystaline structure and larger sized crystals increase the probability of imperfections in the crystal lattice which reduces the rate of return of good circuits per batch. Therefore, to pack more functionality onto a chip, the circuits themselves have to be made smaller.

As the circuits become smaller, the geometries of the transistors and other associated components making up the memory cell approach closer and closer to the sizes of atoms and molecules themselves. In particular, the amount of charge stored in a memory cell to indicate whether a 1 or a 0 is stored in that cell, becomes smaller as the geometry of the storage cell itself becomes smaller.

Alpha particles are charged particles which are emitted from various materials used in the packaging and construction of integrated circuits in the process of natural radioactive decay. These particles can pass through the bit lines, sense amplifiers, and storage cells of a memory cell, thereby upsetting the charge distribution and causing what are called soft errors. Essentially, a soft error is found in any word stored in a memory (each word is a predetermined number of bits in memory) where the pattern of binary 1's and 0's coming out of the memory has been changed by an alpha particle from the pattern of 1's and 0's originally stored in the memory. The single and multiple soft errors can be detected and corrected using error correction codes. These error correction codes utilize additional bits called check bits which are generated from the original data word and which are stored with it. By reversing the process of generating the check bits when the word is read out from memory, the binary pattern of 1's and 0's coming out can be checked against what it is supposed to be utilizing the check bits stored with the data.

Hamming codes are forward acting error correction codes which use certain binary codes designed to self-correct data altered by extraneous events such as "soft errors".

Forward acting error correction codes can be divided into two broad classes: block codes and convolutional codes. In block codes, data bits are taken k at a time and c parity bits are each to check a different combination of the data bits. A block consists of $n = k + c$ bits. A systematic code is one in which the information bits occupy the first k position in a block and are followed by the (n-k) check bits.

A convolutional code is one error correction code wrapped around or convoluted on another. It is the convolution of an input data stream and the response function of an encoder. Usually the encoder is made up of shift registers, and modulo 2 adders are used to form check bits, each of which is a binary function of a particular subset of the data bits in the shift registers. The system disclosed herein utilizes a block code.

Another block code is the group code where the modulo 2 sum of any two n-bit code words is another code word. Modulo 2 in addition is denoted by the symbol 0. It is binary addition without the "carry", i.e., $1 + 1 = 0$ without the carry. In hardware terms, modulo 2 addition can be carried out by an exclusive-OR gate. For example, summing 10011 and 11001 in modulo 2, we get 01010.

The minimum Hamming distance is a measure of the error detection and correction capability of a code. This "distance" is the minimum number of digits in which the two encoded words differ. For example, to detect E digits in error, a code of a minimum Hamming distance of $(E+1)$ is required. To correct E errors, a code must display a minimum Hamming distance of $(2E+1)$. A code with a minimum Hamming distance of 5 can correct a single error and detect some two digit errors in a data word of 16 bits.

Reliable memory systems can be designed either by using highly reliable but expensive components or by employing inexpensive protective redundancy in terms of error correcting codes that use redundant check bits. The degree of reliability can be increased if this protective redundancy matches the failure mode of the memory system. Because of lower cost, higher speed, and higher density, semiconductor RAM chips are replacing core memories and single bit errors are more probable in these chips than multiple bit errors.

However, single bit errors can become multiple bit errors if not corrected before a second alpha particle strikes and changes another bit. Hence, it is highly desirable that a memory have a constant on-going error correcting process in addition to error correction on every access of a data word. Such an on-going error correction process acting independently of error correction on access of data would tend to catch and correct single bit errors before they became double bit errors.

SUMMARY OF THE INVENTION

The improved self correcting dynamic memory disclosed herein utilizes circuitry to error correct a selected word in a selected row that is being refreshed during each refresh cycle. Decoder circuitry coupled to an external address bus and to the refresh counter provide means for causing the refresh to occur and to select one data word during each refresh cycle for correction and restoring by the error correction circuitry.

The error correction circuitry is comprised of hardware in the memory which generates check bits from data to be stored using an algorithm. The check bits are then stored with the data bits of each word of data. When the data is read out from the memory during the refresh cycles or during normal memory access, the check bits stored with the data word are used to check the accuracy of the word read out compared to the word stored. If a single bit error is detected, it is corrected utilizing the check bits. The check bits can be independently accessed from the memory.

BRIEF DESCRIPTION OF THE DRAWINGS

FIG. 7 is a flow diagram of the steps followed by the CPU in checking the correct operation of the memory error correcting apparatus.

DETAILED DESCRIPTION OF THE PREFERRED EMBODIMENT

Figure 1:
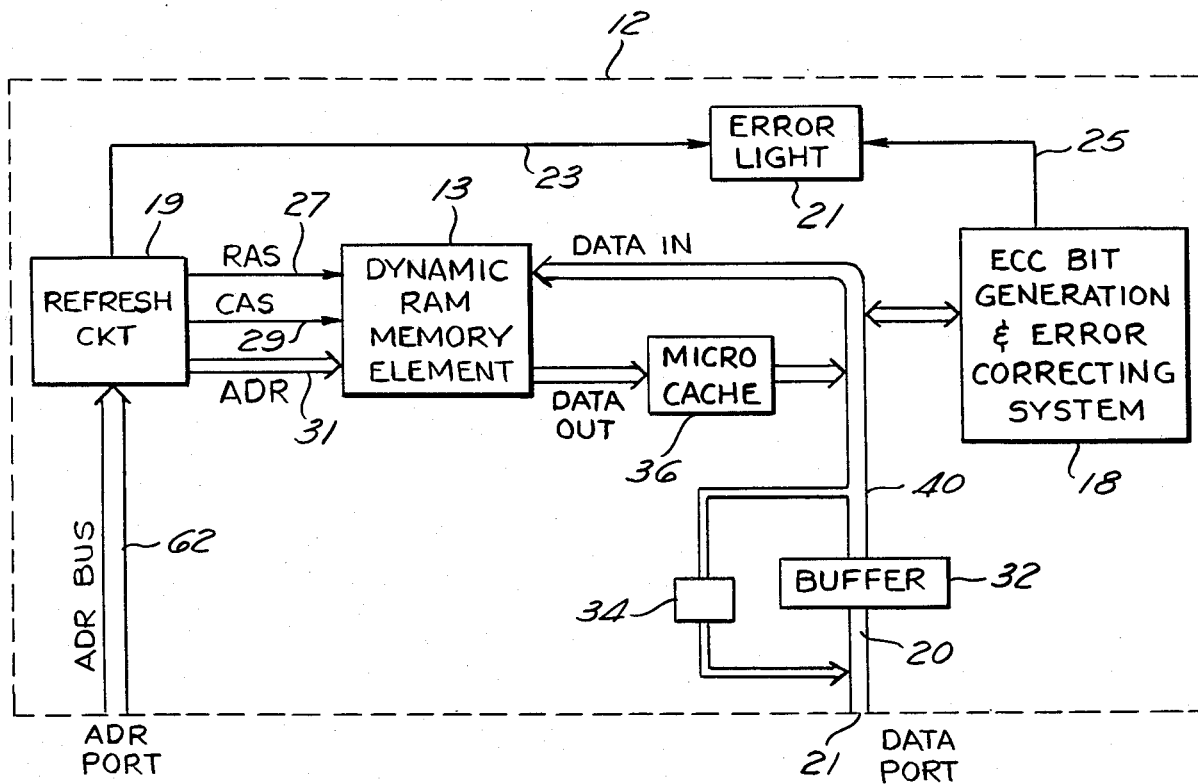
FIG. 1 is an overall block diagram of a dynamic memory with an error correction on refresh feature.

Referring to FIG. 1, there is shown a block diagram of a self correcting memory 12 with an error correction on refresh feature. Dynamic RAM memory element 13 is comprised of a plurality of random access memory chips; in the preferred embodiment, these chips are Mostek MK4116 16K×1 chip RAM's. Each memory chip in memory element 13 utilizes a set of multiplexed address inputs and has row address strobe, i.e., RAS, and column address strobe, i.e., CAS, inputs. Each memory chip is comprised of an array of individual storage cells arranged in a matrix that is 16,384×1 bits in dimension. Each array is coordinated with all the other arrays in the other chips to create the memory element 13. In the preferred embodiment, memory element 13 is organized such that a plurality of multiple bit data words are stored therein in rows and columns. Each data word of 16 bits has an upper and lower 8 bit byte. Each word has a row address and a column address which is used in writing the data word to its storage location and in retrieving the data word from that location.

It takes 14 bits to address 16,384 locations. Because there are only seven address input pins available to receive these 14 address bits due to the constructional limitations of integrated circuit manufacture and the industry standard of 16 pins per package, the 7 address input pins are multiplexed using the RAS and CAS input strobes. That is, when an incoming data word is written into the memory, it is written to the row having the address at the address inputs at the time the RAS signal is activated and it is written into the column in the selected row which has the address present at the address inputs at the time the CAS signal is activated. The same mode of operation exists for retrieving data words from locations in memory.

Because fewer transistors are required per storage cell for a dynamic RAM cell than for a static RAM cell, dynamic RAM's are cheaper and have been widely used by computer manufacturers. However, dynamic RAM's must be refreshed to periodically rewrite the data to each cell to prevent data loss. The dynamic RAM chips used in the preferred embodiment refresh the entire row of locations which has the address present at the address inputs at the time the RAS signal is activated. This is true whether the RAS signal is activated during a data access or a refresh cycle.

When retrieving data from the memory, the data at a particular row and column address is presented at the data output after the CAS signal has latched in the column address. During normal refreshing of a dynamic RAM memory, a refresh counter or other addressing means sequentially generates addresses for each row in the memory by counting pulses which mark the boundaries of the refresh cycle. If during each refresh cycle, one column address is generated and the CAS signal is activated, one word out of the refreshed row will be read out of the row being refreshed upon receipt of a CAS signal. This is the mechanism that is used for error correction on refresh. The word so read can be error corrected and rewritten into the same location. Eventually each word in the memory will have been read, corrected and rewritten after a predetermined number of refresh cycles depending upon the size of the memory.

In the preferred embodiment, the memory element 13 is divided into a plurality of segments with interleaved addresses. That is, in the preferred embodiment, the memory element 13 is divided into four quarter segments called quadrants with each quadrant storing one fourth of the total number of words stored in the memory.

"Interleaved addresses" means that the word in address number 1 would be stored in the first quadrant, and the word in address number 2 is stored in the second quadrant. Likewise, the word in address number 3 would be stored in the third quadrant and the word in address number 4 would be stored in the fourth quadrant.

Figures 3, 4:
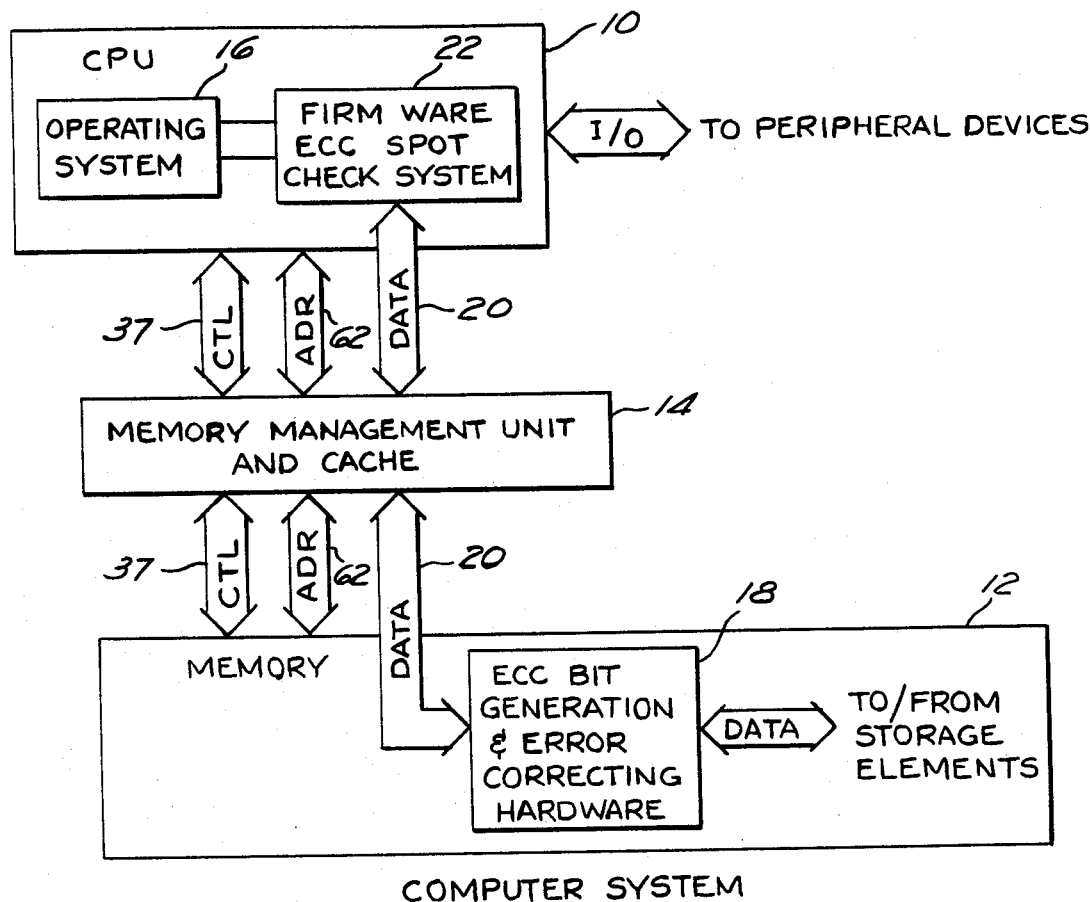
FIG. 3 is a block diagram of the improved computer system utilizing a self correcting memory and apparatus in the CPU which checks for correct operation of memory's error correcting system.
FIG. 4 is a truth table used by the error correction system.

The probabilities are that when a program retrieves the data in address number 1, the next data word that will be retrieved will be in one of addresses 2, 3 or 4. Thus, a faster memory can be designed if entire blocks of data words are retrieved for temporary storage in ultra fast cache memories upon each access of a single data word from the slower memory chips in the main memory element 13. The micro cache 36 in FIGS. 1 and 3 illustrates such a memory arrangement.

Micro cache 36 is coupled to the data outputs of the memory element 13 such that 4 data words are retrieved and stored in the micro cache 36 for every access to memory element 13. That is, if the data word in address 1 is sought, that word plus the words in addresses 2, 3 and 4 are all accessed and stored in the micro cache 36. Thus, if the next access is for a data word in either address 2, 3 or 4, the data will already be present in the micro cache 36 thereby enabling a faster access by eliminating the need for going through the slower memory access cycle of the main memory element 13. The memory access cycle of the main memory element is slower because a number of internal events not relevant to discussion of the invention disclosed herein must occur in sequence. This sequence is started by starting a clock in the memory 12 every time an access is made. Standard comparator circuitry not shown in the figures compares a portion of the requested address to the same portion of the last address accessed to determine if the desired word is stored in the micro cache 36.

The data output of the micro cache 36 is coupled to an internal data bus 40, which data bus is also coupled to the data inputs of memory element 13. Buffers 34 and 32 serve to interface between the micro cache 36, the main memory element 13, the ECC bit generation and error correcting system 18, ECC system for short, and the other parts of the computer system coupled to the data port 21. Separate buffers 32 and 34 enable independent access to the ECC bits stored with each data word as will be explained later. This separate accessibility structure leads to an enhanced diagnostic capability in checking the correct operation of the ECC system 18.

The ECC system 18 serves to detect errors in data words, correct them, and restore them during the error correction on refresh cycles. During normal accesses of data through data port 21 in the read mode, the ECC system 18 serves to detect errors in the data word on the internal data bus 40, correct them and to place the corrected word on the internal data bus 40 for use by the calling device. The structure and operation of the ECC system 18 will be explained more fully below.

The refresh circuit 19 serves to complete the addressing of the various segments in the memory element 13 using the RAS and CAS signals and serves to cause repeated refresh cycles to occur. The refresh circuit also generates sequential addresses such that each row in each segment of memory element 13 is repeatedly refreshed. One row in each segment is refreshed during each refresh cycle. The refresh circuit 19 also causes one data word from the rows being refreshed to be selected, read out, and placed on the internal data bus for correction by the ECC system 18.

The refresh circuit 19 is coupled to an address bus 62 for coupling to a CPU and to other units in the system. The refresh circuit 19 is also coupled to the RAS, CAS and address inputs of the memory element 13 by buses 27, 29 and 31 respectively. By controlling these signals, the refresh circuit controls which row in each segment of the memory element 13 that is being refreshed during each refresh cycle. These signals also control which word in a selected row is to be read out from memory element 13 for error correcting. Control inputs to the micro cache 36 control which of the data words is placed on the internal data bus 40 for error correction. The CAS signals on bus 29 also control an upper and lower address boundary into which each quadrant is divided. That is, memory with a capacity of 128,000 16 bit words is comprised of two 64K word halves. Each quadrant of memory element 13 is divided into an upper and lower half, each of which respond to ½ of the 128K word address space. The refresh circuit 19 decodes the CAS signals to control whether the upper or lower half of each quadrant is being addressed at any particular time. The quadrant to be written into is controlled by decoding certain bits on the address bus to generate RAS signals for the selected quadrant as will be explained more fully below.

An error light 21 detects and signals when the ECC system 18 has detected and corrected an error during a refresh cycle. The error light is coupled to the ECC system by a line 25 which carries a signal which indicates when an error has occurred during a refresh cycle.

The error light 21 is also coupled to the refresh circuit 19 by a line 23 carrying a periodic signal from the refresh counter which causes a latch associated with the error light to be reset during the next period unless a new error is detected during the next period. This structure gives an enhanced reliability since a visible indication is given when error correction is occurring, a phenomenon which is normally invisible to the memory user. In the preferred embodiment, the error signal is a light which, if constantly blinking, indicates there is some problem in the memory circuit.

Figure 2:
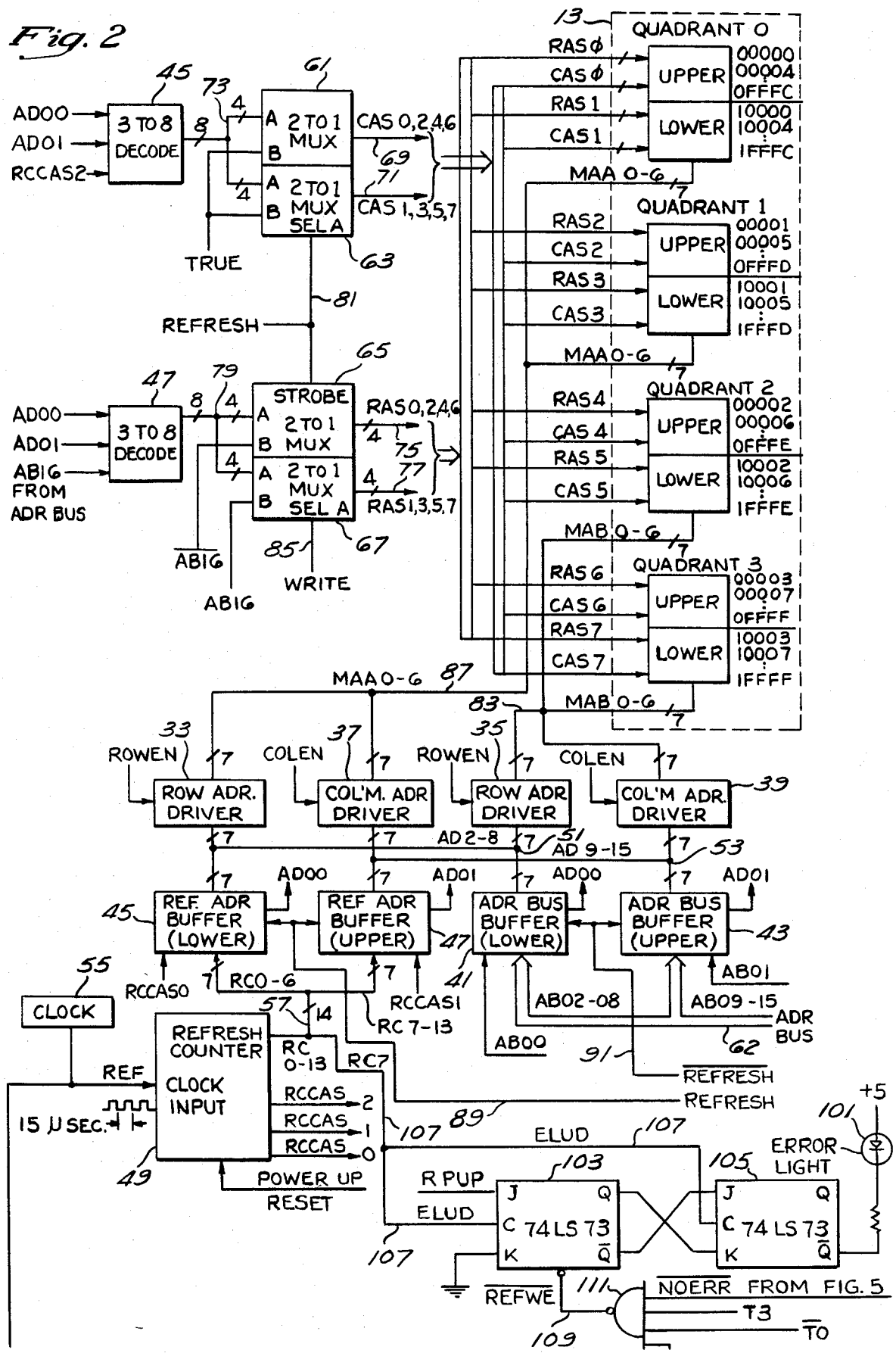
FIG. 2 is a block diagram of the structure of the refresh circuitry used for error correction on refresh.

Turning now to FIG. 2 there is shown a more detailed diagram of the refresh circuit 19. Memory element 13 is comprised of four quadrants 0-3, each quadrant comprised of an upper half storing the upper 64K words of the memory capacity and a lower half storing the lower 64K words of the memory capacity. Each half of each quadrant has a separate RAS and CAS input and a separate multiplexed address input for receiving the address bits MAA 0-6 for quadrants 0 to 1 and MAB 0-6 for quadrants 2 and 3.

The address inputs are driven by row address drivers 33 and 35 and column address drivers 37 and 39. The drivers 33, 35, 37 and 39 have enable inputs to receive, respectively, the row enable signal, ROWEN, and the column enable signal, COLEN. The ROWEN and COLEN signals enable the outputs of the respective drivers when the address bits to be supplied to the memory chips either during a refresh cycle or normal operation are respectively, the row address bits or the column address bits. The ROWEN and COLEN signals are controlled by logic not shown and not relevant to the description of the invention. Any design that will activate the drivers at the proper time will be adequate.

Row address driver 35 and column address driver 39 are driven by address bus buffers 41 and 43 respectively which buffers serve to isolate the address bus 62 from excessive loading by the memory. Driver 35 is driven by address bits AD 2-8 and driver 39 is driven by address bits AD 9-15. Address bit AD00 is output from buffer 41 and address bit AD01 is output from buffer 43; both signals are generated respectively from the AB00 and AB01 signals on the address bus. AD00 and AD01 are each coupled to decoders 45 and 47 and are used by the CPU to complete the addressing of the memory. The signals AD00 and 01 cause the decoders 45 and 47 to generate the proper RAS and CAS signals for the quadrants involved. The RAS and CAS signals to be applied to the memory element 13 change depending upon whether the memory is in a read cycle, a write cycle or a refresh cycle.

Drivers 33, 35, 37 and 39 and buffers 41 and 43 control addressing of the memory chips in the four quadrants during normal memory access operation. Addressing during refresh operations is controlled by drivers 33, 35, 37 and 39 and buffers 45 and 47. The buffers 45 and 47 are driven by a refresh counter 49. Switchover between the sets of address drivers and buffers is controlled by the REFRESH and $\overline{\text{REFRESH}}$ signals on lines 89 and 91 respectively coupled to enable inputs of the buffers 45, 47, 41 and 43. More precisely, addressing of the memory element 13 is controlled by buffers 41 and 43 in conjunction with drivers 33, 37, 35 and 39 during normal access operations by virtue of busses 51 and 53. The busses 51 and 53 respectively couple the outputs of buffers 41 to the inputs of drivers 35 and 33 and couple the outputs of buffer 43 to the inputs of drivers 39 and 37 during non refresh times.

During refresh cycles, the REFRESH signal turns buffers 45 and 47 on and the $\overline{\text{REFRESH}}$ signal turns buffers 41 and 43 off. In this state, buffer 45 drives drivers 33 and 35 by bus 51, and buffer 47 drives drivers 37 and 39 by bus 53.

Clock 55 generates a periodic pulse train having a 15 microsecond period which marks the time boundaries for refresh cycles. These clock pulses are the signal REF and are coupled to the clock input of the refresh counter 49. The refresh counter 49 counts the clock pulses and generates row and column address signals. These row and column address signals RC 0-13 are coupled to the inputs of buffers 45 and 47 by a bus 57. Bits RC 0-6 are coupled to the buffer 45 to serve as the row address and bits RC 7-13 are coupled to the data input of the buffer 47 to serve as the column address. Three additional bits RCCAS 0-2 are also generated for use in RAS and CAS generation by the decoders 45 and 47.

The RCCAS 0 signal during the refresh corresponds to the AC00/AD00 signal during normal operation and the RCCAS 1 signal corresponds during the refresh cycles to the AB01/AD01 signal during normal operation. The RCCAS 2 bit during refresh cycles corresponds to the AB16 bit on the address bus during normal operation and controls whether the upper or lower half of each quadrant is being addressed during refresh cycles.

RAS/CAS generation during the various modes of operation of the memory are controlled by decoders 45 and 47 and multiplexers 61,63,65 and 67. Multiplexers 61 and 63 each have A and B inputs which are switched alternately to a single set of CAS outputs on busses 69 and 71. The busses 69 and 71 are coupled to the CAS inputs of the memory element 13. The A inputs of the multiplexers 61 and 63 are coupled to an 8 line bus 73 switched through to the CAS lines of busses 69 and 71. The signal on the active line of the bus 73 will therefore be transferred through either multiplexer 61 or 63 to the selected CAS input of the memory element 13. The CAS input to be activated is selected by decoding of the binary combination bits at the inputs to decoder 45. These bits are controlled by the refresh counter 49 during refresh cycles. During normal operation the A inputs of the multiplexers 61 and 63 are not selected so the state of the inputs to decoder 45 are irrelevant.

The multiplexers 65 and 67 have their outputs coupled to the RAS inputs of the segments of the memory element 13 by busses 75 and 77. The A inputs of the multiplexers 65 and 67 are coupled by an 8 line bus 79 to the outputs of the decoder 47. The B inputs of the multiplexers 65 and 67 are coupled to the AB16 and $\overline{\text{AB16}}$ signals respectively from the address bus 62. The binary data inputs of the decoder 47 are coupled to the AD00 and AD01 from the buffers 45 and 47 or 41 and 43 depending upon whether the memory is operating in a refresh cycle or in the normal memory access mode.

The select A control inputs of the multiplexers 65 and 67 are coupled to a WRITE signal. The WRITE signal is derived by control logic not shown from control signals from the CPU 10 in FIG. 3. The CPU 10 controls whether the memory 12 is in a read or write mode by signals on the control bus 37 in FIG. 3.

The strobe inputs of multiplexers 65 and 67 are both coupled to a REFRESH signal on line 81. The REFRESH signal is generated by control logic on the memory not shown in FIG. 2. The REFRESH signal indicates when the memory 12 is operating in a refresh cycle. The design of the control circuitry to generate the REFRESH and WRITE signals will be apparent to those skilled in the art and will not be described in detail here so as to not overly complicate the description of the invention.

RAS/CAS signal generation during the write mode in normal access operation requires that a RAS signal be generated for one of the four quadrants of the memory element 13 and that either the upper or lower half selected. The CAS signal is presented to all quadrants, but data will only be written into the memory segment receiving the RAS signal. During the write mode, REFRESH on line 81 is inactive thereby causing multiplexers 61 and 63 to select their B inputs coupled to the TRUE signal which is in a constant logical true state. Thus all CAS lines on buses 69 and 71 will be true during the write mode. Of course the exact row and column into which the data is written will be determined by the address bits on the internal address buses 87 and 83. The row address bits are strobed in by the selected RAS signal and the column address bits are strobed in by the blanket CAS signals. These address bits are controlled in the write mode by the CPU 10 in FIG. 3. The CPU 10 is coupled to the multiplexed address pins of the memory element 13 through the address bus 62, buffers 41 and 43, and drivers 33, 37, 35 and 39. During the write mode, the CPU 10 also sends a write enable signal to the memory on the control bus 37 in FIG. 3. This causes the control logic in the memory to activate the WRITE signal on line 85 and causes the multiplexers 65 and 67 to select the A inputs. With the A inputs selected, the AB00 and AB01 bits on the address bus 62 control the selection of one of the four quadrants for RAS via the AD00 and AD01 signals at the input to decoder 47. The AD00 and AD01 signals are derived by the buffers 41 and 43 from the AB00 and AB01 address bits. The AB16 input signal to the decoder 47 from the address bus 62 controls the selection of either the upper or lower half of the selected quadrant.

In the read mode, RAS signals are sent to all four quadrants. This causes a four way read to occur, thereby sending the desired word and the bytes in the three following addresses into the micro cache 36 in FIG. 1. The only selection that is made with respect to the RAS signals in the read mode is whether to send them to the upper or lower half of each quadrant. Because CAS is sent to all quadrants in the read mode, each read is a four way cache update.

In the read mode, the REFRESH signal on line 81 will be inactive thereby causing the multiplexers 61 and 63 to select their B inputs coupled to the TRUE signal. Because the TRUE signal is always in the logical true state, all CAS signals will be true in the read mode.

During refresh cycles, all RAS signals are strobed true by the action of the REFRESH signal on the strobe inputs of the multiplexers 65 and 67. The REFRESH signal on line 81 indicates that the memory is operating in a refresh cycle, and it has the effect of forcing an override condition on the multiplexers 65 and 67. The override condition forces all the RAS signals to a true state such that decoding by the decoder 47 is ignored during refresh cycles. With all RAS signals true, every row in the array having the row address strobed in by the RAS signals will be refreshed.

During refresh cycles, the REFRESH and $\overline{\text{REFRESH}}$ signals on lines 89 and 91 cause buffers 45 and 47 in conjunction with the refresh counter 49 to take over the addressing function. In this mode, bits RC 0–13 on bus 57 serve as the row and column addresses for the memory element 13. One row and one column address exist on the output bits RC 0–13 for each refresh cycle. Upon receipt of the next clock pulse from the clock 55 on the REF signal line, the refresh counter 49 increments and the next row and column address for refresh operations will be presented at the outputs RC 0–13. Eventually, all possible row and column addresses will have been presented on the output lines and all rows will have been refreshed. In the preferred embodiment there are 128 rows in each quadrant all of which must be refreshed every 2 milliseconds. Refresh of a row occurs every time the RAS signal is activated with the selected row address on the address inputs of the quadrants. Thus RAS must be activated once for each of the 128 possible row addresses within every 2 milliseconds. This is accomplished by driving the refresh counter 49 with a 15 microsecond period pulse train, i.e., 15 microseconds times 128 equals 1.9 milliseconds.

The error correction on refresh is accomplished by issuing a CAS signal to either the upper or lower half of a selected one of the quadrants. This CAS selection is accomplished by decoder 45 working in conjunction with the multiplexers 61 and 63. The multiplexer 45 decodes the RCCAS 0–2 signals from the refresh counter 49 to select the desired quadrant and the desired half of the selected quadrant. The AD00 and the AD01 signals at the input of the decoder 45 are the AD00 and AD01 outputs of the buffers 45 and 47 and are derived respectively from the RCCAS 0 and 1 inputs to the buffers from the refresh counter 49. The RCCAS 2 bit from the refresh counter 49 corresponds to the address bit AB16 during normal operation in selecting either the upper or lower half of the selected quadrant. The AD00 and 01 bits are decoded to select the desired quadrant. During the refresh cycles, the REFRESH signal is true thereby causing the multiplexers 61 and 63 to select their A inputs and pass the decoded CAS signal on bus 73 to the selected CAS line on the output busses 69 and 71.

The data word in the refreshed row of the selected quadrant at the column specified by the column address is then output. The selected word is then error corrected and re-stored in the same location all during a single read-modify-write cycle of the memory chips involved. Double bit errors remain unmodified. At the correction rate utilized in the memory of the preferred embodiment, every word in the entire memory array is checked once every 2 seconds.

Referring again to FIG. 2 there is shown, in the lower right hand corner, the structure of the error light circuitry 21. This circuitry signals when the selecting and correcting circuitry for the error correct on refresh function has found an error during a refresh cycle. In the preferred embodiment a light emitting diode 101 is used.

Two error detect J-K flip-flops 103 and 105 are clocked by a line 107 from the refresh counter 49. The particular output from the refresh counter 49 selected for this function is selected such that the ELUD signal on line 107 makes a negative transition approximately every 60 milliseconds.

Any error detected during a refresh cycle will cause a write enable pulse on line 109 designated as the $\overline{\text{REFWE}}$ signal. This signal is derived from the output of NAND gate 111 and is coupled to the reset input of the flip flop 103. Flip flop 103 also has its J input coupled to the RPUP signal and its K input is grounded. The RPUP signal is a logic one when the memory 12 is operating with the ECC system functioning. In the preferred embodiment, flip flops 103 and 105 are of the 74LS73 J-K type with a clear input such as are manufactured by Texas Instruments Incorporated. The RPUP signal is normally high for all relevant times; thus, with a high on the J input and a low on the K input, any negative transition of the ELUD signal will set the Q output of the flip flop 103 at the logical 1 state. The Q and $\overline{\text{Q}}$ outputs of the flip flop 103 are coupled respectively to the J and K inputs of the flip flop 105. Since the clock input of the flip flop 105 is coupled to the ELUD signal, the next negative transition of ELUD with the Q output of flip flop 103 high will reset flip flop 105. When flip flop 105 is reset, the $\overline{\text{Q}}$ output is high. Since the error light 101 is coupled between a voltage source and the $\overline{\text{Q}}$ output of the flip flop 105, the error light will remain unlit because of the logic 1 voltage level on $\overline{\text{Q}}$.

However, when the $\overline{\text{REFWE}}$ signal makes a high to low transition because an error has been found during a refresh cycle, flip flop 103 will be reset regardless of the logical state at the inputs to flip flop 103. Thus the Q output of the flip flop 103 will go low. Therefore, the flip flop 105 will be set on the negative transition of the ELUD signal during the next 60 millisecond period thereby turning on the error light 101. After the $\overline{\text{REFWE}}$ signal returns to a logic one state, the next negative transition of ELUD will set flip flop 103 and cause flip flop 105 to be reset to a state with the $\overline{\text{Q}}$ output in the logical 1 state. This shuts off the error light 101 unless another error is found. Thus for any error during a given 60 millisecond period, the error light 101 will be lit during the following 60 millisecond period.

The $\overline{\text{REFWE}}$ reset pulse is generated by NAND gate 111 which has its inputs coupled to the signals $\overline{\text{NOERR}}$, T0, T3 and REF. The signal REF comes from the clock 55; The $\overline{\text{T0}}$ and T3 signals come from the control logic of the memory not shown in FIG. 2. A clock on board the memory is started for a new sequence for every memory access. Standard counter logic not shown counts the clock pulses and establishes a number of sequential time period signals designated T0, T1 etc. which are used for coordinating various internal events that occur during each memory access and error correction operation. The signals $\overline{\text{T0}}$ and T3 are two of these sequential time signals which establish the correct window for receipt of the $\overline{\text{NOERR}}$ signal. The $\overline{\text{NOERR}}$ signal is derived from the ECC system 18 shown in FIGS. 1 and 5 and indicates when an error has been found by the ECC system during a refresh cycle. The NAND gate 111 combines all this information into a negative going pulse when an error has been found during a refresh cycle.

We turn now to a detailed explanation of the circuitry and algorithm for accomplishing reliable error correction.

An improved computer system utilizing a selfcorrecting memory and apparatus to spot check the correct operation of the memory error correcting apparatus is shown in FIG. 3. A CPU 10 includes all the conventional hardware including temporary storage operating registers and/or scratchpad memory and an arithmetic logic unit to perform arithmetic and logical operations on operands brought in from a memory 12 or a cache memory 14 under the control of a control unit which decodes instructions stored in the memory 12 or the non-volatile memory storing the instructions which control operations for the ECC spot check system 22. The CPU 10 performs the operations of various applications programs under the supervision of a set of computer instructions called an operating system shown schematically at 16. In reality, the instructions of the operating system and the application programs are stored in the memory 12 along with the operands or raw data to be operated upon by the CPU 10. The main cache 14 is a bigger capacity cache memory than the micro cache 36 of FIG. 1. The main cache 14 further speeds up the operation of the memory by eliminating memory access cycles for words that are already stored in the main cache 14. The main cache 14 has a larger capacity than the micro cache 36. The memory includes an ECC bit generation and error correcting system (ECC system) 18 which generates check bits from data coming into the memory 12 on a data bus 20 for storage. These check bits are generated utilizing an algorithm described in an article in Computer Design for May 1978 entitled "Single Error Correcting Code Maximizes Memory System Efficiency" by S. Sangal and K. N. Venkataraman at page 175. This algorithm will be described in more detail below.

The check bits generated by the ECC system 18 for each incoming data word are stored with that data word in the memory 12. The ECC system 18 also served to correct data being retrieved from the memory 12 utilizing the check bits stored for that data, and it permits the check bits to be retrieved from the memory 12 independently from the data bits.

The CPU 10 includes a set of spot check instructions which, in the preferred embodiment, are permanently stored in control store firmware, i.e., non-volatile memory such as a ROM. In other embodiments, the ECC spot check system 22 could be dedicated hardware that generates new check bits which form a syndrome pattern from the corrected data being retrieved from memory. The CPU can generate the check bits in either parallel or serial fashion. Serial fashion is used in the preferred embodiment. That is, five check bits must be generated, each from a different subset of data bits from the data being retrieved from the memory 12. A check bit is generated by a bit masking operation followed by a parity test. The parity test is followed by an operation to set the check bit according to the results of the parity test. The preferred embodiment utilizes a series of computer instrucitons stored in non-volatile memory to perform these functions seriatim. This ECC spot check system 22 utilizes the algorithm to be described below to cause the general purpose hardware of the CPU to check the correct operation of both the check bit generation and error correction operations of the ECC system 18 in the memory 12 upon the occurrence of a predetermined signal. This predetermined signal can be any random or periodic event that occurs during the operation of the CPU. Generally, the CPU ECC spot check system 22 performs a predetermined sequence of microcode instructins causing events and logic operations within the circuitry of the CPU 10 which duplicates the generation of the check bits in the ECC system 18 in memory 12 so that the two syndromes, i.e., groups of check bits can be compared. For purposes of speed, the memory ECC system 18 generates all its check bits simultaneously while the firmware ECC spot check system 22 causes a seriatim series of operations on the incoming data word to generate the check bits of the syndrome one at a time.

The algorithm used by both the ECC spot check system 22 and the ECC system 18 is as follows. To be able to correct a single bit error, information in the form of check bits is needed to point to the location of an error. Once the bit position of the error is known, the bit can be flipped to the opposite logic state and the error will be corrected. For a given word length, the Hamming relationship determines how many check bits are required to be able to locate all single bit errors. The Hamming relationship is:

$$2^m \geq d + m + 1 \qquad (1)$$

where
m = the number of check bits
d = the number of data bits.

That is, the check bits must describe d+m+1 different bit patterns. For 16 data bits, 5 check bits are required. Only 16+5 or 21 bits are needed to point to all possible single bit errors and to the no error condition, i.e., where no bit is in error.

With five check bits, $2^5$ or 32 different bit patterns, called syndrome patterns, can be formed. The all zero pattern represents the no error condition. Of the remaining 31 possible patterns, 21 are used to point to errors leaving 10 unused patterns. These 10 unused patterns can be used to maximize the percentage of double bit errors which can be detected.

In a 21-bit memory, there are 210 distinct possibilities for two bit errors, i.e., 21 things taken 2 at a time. A string of bits can be likened to a vector in multidimensional space. Thus, whenever a double error occurs, such that the modulo-2 addition of the two vector patterns corresponding to the two bits in error results in one of the ten unused syndrome patterns, that double error can be detected.

The probability of errors remaining undetected can be reduced greatly by maximizing the percentage of double bit errors detected and using the 10 unused syndrome patterns, represented by 10 unused outputs from the syndrome pattern decoders, to signal when a detectable double error has occurred. The extra hardware required to implement this double error detection capability is a single 10 input NAND gate.

The following technique describes how the syndrome patterns, called parity check matrices can be directly derived using the data and check bits. Mathematically, the essence of the algorithm is:

$$v \cdot H^T = 0 \qquad (2)$$

where
v = a string of bits representing a binary coded message of order N = d + m, and
$H^T$ = the transpose of a parity check matrix H comprised of the syndrome patterns.

If the H matrix is represented as $$\begin{vmatrix} h_{11} & h_{12} & h_{13} & \cdots \\ h_{21} & h_{22} & h_{23} & \cdots \\ h_{31} & h_{32} & h_{33} & \cdots \\ \vdots & & & \end{vmatrix} \qquad (3)$$

then $H^T$ is $$\begin{vmatrix} h_{11} & h_{21} & h_{31} & \cdots \\ h_{12} & h_{22} & h_{32} & \cdots \\ h_{13} & h_{23} & h_{33} & \cdots \\ \vdots & & & \end{vmatrix} \quad (4)$$

A coded message v can be represented as $a_1, a_2 \ldots a_i \ldots a_n$ where each $a_i$ corresponds to one bit position of the message. The element of the H matrix at row i, column j, can be represented as $h_{ij}$. Thus, equation 2 means that the summation over all j of $$a_j h_{ij} = 0 \quad (5)$$

for all i values.

The parity check bits can be generated using equation 5. That is, for each row of H, the number of 1's in v corresponding to the number of 1's in that row, i.e., the dot product of v and each row of H, will be an even value.

As an example, if the code word is represented by u and an error vector is represented by e, then the resultant erroneous data is u+e in modulo-2 addition. The syndrome pattern for this erroneous data is:

$$SP = (u+e)H^T = uH^T + eH^T \quad (6)$$

where SP = syndrome pattern.

From equation (2), $uH^T = 0$; thus, the syndrome pattern is $eH^2$. If e represents an error in bit k, then the syndrome pattern $SP = eH^T = h_K$, i.e., the corresponding column pattern in the parity check matrix $H^T$ at the position of the error that is at column K.

Referring to FIG. 4, there is shown a parity check matrix for a single error correcting and maximum partial double error detecting code. The syndrome patterns are the vertical columns of 0's and 1's. Inspection of FIG. 4 shows that each syndrome pattern is unique and thus can serve as an indicator for the bit in error. The first sixteen columns correspond to the sixteen data bits and the last five columns correspond to the five check bits.

Implementation of this algorithm into a computer requires circuitry to generate the check bits and store the data in memory. Circuitry is also required when reading from memory to generate all possible syndrome patterns for the parity check matrix. Since from inspection of FIG. 4, the check bits are a single bit located in different check bit positions, check bits therefore can be individually generated. From equation (5) and by inspection of FIG. 4:

| | | (7) |
|---|---|---|
| $C_0 =$ | $(D_4)$ X-OR $(D_5)$ X-OR $(D_6)$ X-OR $(D_7)$ X-OR $(D_8)$ X-OR $(D_9)$ X-OR $(D_{10})$ X-OR $(D_{14})$ X-OR $(D_{15})$ | |
| $C_1 =$ | $(D_1)$ X-OR $(D_2)$ X-OR $(D_3)$ X-OR $(D_7)$ X-OR $(D_8)$ X-OR $(D_9)$ X-OR $(D_{10})$ X-OR $(D_{13})$ X-OR $(D_{15})$ | |
| $C_2 =$ | $(D_0)$ X-OR $(D_2)$ X-OR $(D_3)$ X-OR $(D_5)$ X-OR $(D_6)$ X-OR $(D_9)$ X-OR $(D_{10})$ X-OR $(D_{12})$ X-OR $(D_{14})$ | |
| $C_3 =$ | $(D_0)$ X-OR $(D_1)$ X-OR $(D_3)$ X-OR $(D_4)$ X-OR $(D_6)$ X-OR $(D_8)$ X-OR $(D_{10})$ X-OR $(D_{11})$ X-OR $(D_{13})$ | |
| $C_4 =$ | $(D_0)$ X-OR $(D_1)$ X-OR $(D_2)$ X-OR $(D_4)$ X-OR $(D_5)$ X-OR $(D_7)$ X-OR $(D_{10})$ X-OR $(D_{11})$ X-OR $(D_{12})$ | | where X-OR = the exclusive-OR logic operation. The effect of a string of exclusive-OR operations as required by equation (7) is to determine whether an even or odd number of logic 1's exists in the string of data bits checked by each check bit. After generation of these five check bits, the encoded word, i.e., 16 data bits plus 5 check bits, will follow equation (5) by definition.

When reading data from memory, any single bit errors must be located and corrected. To do this, the syndrome patterns must be generated. Each syndrome pattern consists of 5 bits which will point to the location of the error. The logic equations for generating the syndrome patterns are:

| | | (8) |
|---|---|---|
| $S_1 =$ | $(D_4)$ X-OR $(D_5)$ X-OR $(D_6)$ X-OR $(D_7)$ X-OR $(D_8)$ X-OR $(D_9)$ X-OR $(D_{10})$ X-OR $(D_{14})$ X-OR $(D_{15})$ X-OR $(C_0)$ | |
| $S_2 =$ | $(D_1)$ X-OR $(D_2)$ X-OR $(D_3)$ X-OR $(D_7)$ X-OR $(D_8)$ X-OR $(D_9)$ X-OR $(D_{10})$ X-OR $(D_{13})$ X-OR $(D_{15})$ X-OR $(C_1)$ | |
| $S_3 =$ | $(D_0)$ X-OR $(D_2)$ X-OR $(D_3)$ X-OR $(D_5)$ X-OR $(D_6)$ X-OR $(D_9)$ X-OR $(D_{10})$ X-OR $(D_{12})$ X-OR $(D_{14})$ X-OR $(C_2)$ | |
| $S_4 =$ | $(D_0)$ X-OR $(D_1)$ X-OR $(D_3)$ X-OR $(D_4)$ X-OR $(D_6)$ X-OR $(D_8)$ X-OR $(D_{10})$ X-OR $(D_{11})$ X-OR $(D_{13})$ X-OR $(C_3)$ | |
| $S_5 =$ | $(D_0)$ X-OR $(D_1)$ X-OR $(D_2)$ X-OR $(D_4)$ X-OR $(D_5)$ X-OR $(D_7)$ X-OR $(D_{10})$ X-OR $(D_{11})$ X-OR $(D_{12})$ X-OR $(C_4)$ | |

A syndrome pattern of all zeroes indicates no error; any other pattern will indicate the location of an error.

For example, if a 16-bit data word of all logic 1's is to be encoded with the parity check matrix of FIG. 4, the check bits $C_0$ through $C_4$ from equation (7) will be $C_0 = 1, C_1 = 1, C_2 = 1, C_3 = 1, C_4 = 1$ or [11111]. Thus, the encoded word will be a string of 21 logic 1's.

If a soft error occurs during storage, such that the fourth most significant bit, $D_3$, is caused to read out as a logic zero, the retrieved data would be 1110 1111 1111 1111 1111. The syndrome pattern bits S through $S_5$ from equation (8) will be 01110. This bit pattern corresponds to the syndrome pattern column under $D_3$ in the parity check matrix of FIG. 4. Thus, the error can be located and corrected by changing the logic state of $D_3$.

Figure 5:
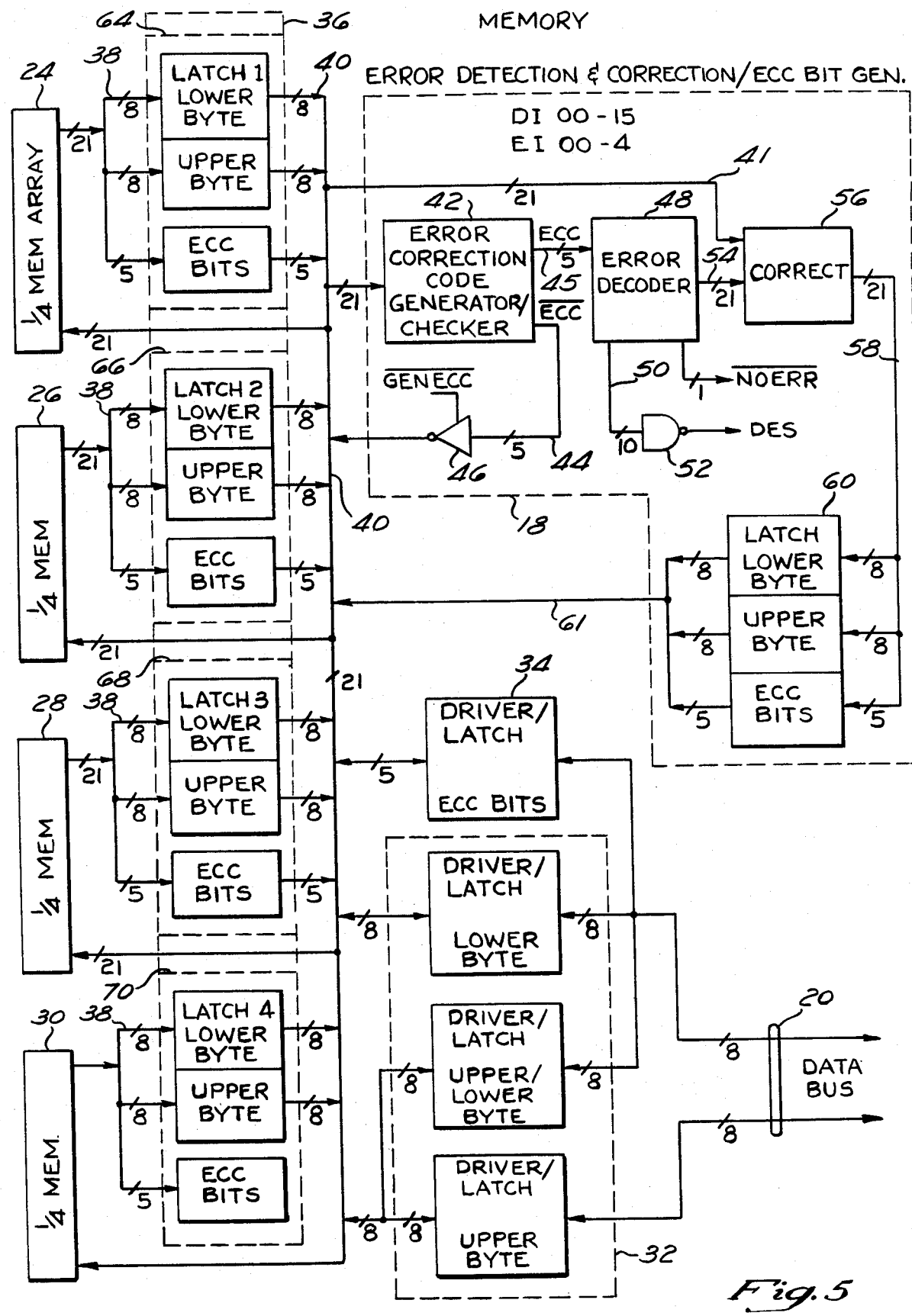
FIG. 5 is a block diagram of the improved memory utilizing apparatus to detect and correct errors.

The circuitry utilized to implement the above-described algorithm for single error correction in a memory is illustrated in FIG. 5 which shows a block diagram of a portion of the circuitry of the memory 12 in FIG. 3, including the structure of the ECC bit generation and error correcting hardware 18. Memory cells 24, 26, 28, 30 store the data bits and check bits of the encoded data and have data inputs and outputs. The data inputs are coupled directly to an internal data bus 40. The data outputs are coupled to the internal data bus 40 by a latch 36. The data bits to be stored or retrieved enter and leave the memory on an external bidirectional data bus 20 through a driver/latch 32. This driver/latch is adapted for coupling to the external data bus 20 and is coupled to the data inputs and outputs of memory cells 24, 26, 28 and 30 by the internal data bus 40. The driver/latch 32 serves to temporarily store data bits being written into or retrieved from said memory cells and for driving the external data bus 20 and the internal data bus 40 with the data bits when the memory cells 24, 26, 28, and 30 are being accessed.

A separate driver/latch 34 is adapted for coupling to the external data bus 20 and is coupled to the data inputs and outputs of the memory cells 24, 26, 28, and 30 by the internal data bus 40. The driver/latch 34 serves to provide independent access to the check bits alone by the CPU by temporarily storing the 5 check bits separately from the data bits and driving the external data bus 20 with these check bits when the CPU is requesting access to the check bits. Control of the driver/latches 32 and 34 is maintained by the CPU 10 through control bus 37 in FIG. 3. It will be apparent to those skilled in the art that any well known control circuitry will suffice for purposes of constructing the invention disclosed herein. The system depicted in FIGS. 1 and 3 is unique from other self-correcting memories in that the 5 check bits may be retrieved from the memory 12 by the CPU 10 independently from the 16 data bits.

The latch 36 has its data input 38 coupled to the data outputs of the segments 24, 26, 28 and 30 of the memory array 12. The data output of the latch 36 is coupled to the bidirectional internal data bus 40 which is also coupled to the data inputs of the segments 24, 26, 28, and 30 of the memory array. The latch 36 temporarily stores the upper and lower 8 bit bytes of the 16 data bits and stores the 5 check bits retrieved from the memory array so that a stable encoded data pattern may be presented on the 21-bit internal data bus 40 during a read cycle.

The error detection and correction/ECC bit generation system 18, ECC system for convenience, serves to generate the check bits from the incoming data bits to be stored. The ECC system 18 also causes these check bits to be stored with each set of incoming data bits from which the check bits were generated as a 21-bit encoded data word. This operation occurs during the write mode when the CPU 10 in FIG. 1 is storing data in the memory 12. During the read mode the CPU 10 is retrieving data from the memory 12 via the data bus 20. In this mode the ECC system 18 serves to detect and correct errors in the data being retrieved from the memory 12 utilizing the check bits stored with that retrieved data word.

These operations are performed by the ECC system 18 utilizing the above-described algorithm. The ECC system includes an error correction code generator/checker 42, ECC generator for convenience, having 21 data input lines coupled to the internal data bus 40. An $\overline{\text{ECC}}$ output bus 44 of the ECC generator 42 is coupled to the input of a tri-state inverter 46 which has its output coupled to the internal data bus 40. A control line $\overline{\text{GE}}$ $\overline{\text{NECC}}$ coupled to a tri-state control input of the inverter 46 enables and disables the inverter. The $\overline{\text{GE}}$ $\overline{\text{NECC}}$ signal is controlled by the CPU 10 in FIG. 3 indirectly in that it is derived by control circuitry in the memory 12 not shown in FIG. 5 so as to indicate the ECC system 18 when the memory is in the read mode.

An error decoder 48 has a data input coupled to an ECC output bus 45 of the ECC generator 42. The error decoder 48 has a single output line $\overline{\text{NOERR}}$ for signalling when no error has occurred and a double error output bus 50 coupled to the inputs of a 10-input NAND gate 52. The NAND gate 52 has an output DES which indicates when a double error has occurred. The error decoder 48 also has a 21-bit output bus 54 coupled to the input of a correction circuit 56. The correction circuit 56 also has a data input 41 coupled to the internal data bus 40 and has an output bus 58 coupled to the input of a latch 60. The output bus 61 of the latch 60 is coupled to the internal data bus 40.

In the write mode incoming data from the CPU via data bus 20 is latched into the latch 32. This data is presented on the internal data bus 40 to the input of ECC generator 42, which, using gates to implement equation (7), generates 5 check bits and presents them on the ECC output bus 45. The inverse of the 5 check bits are presented by the ECC generator 42 at the input of the inverter 46 via the $\overline{\text{ECC}}$ output bus 44. The $\overline{\text{GE}}$ $\overline{\text{NECC}}$ signal, under the control of the CPU 10, enables the inverter 46 thereby gating the newly generated check bits onto 5 lines of the internal data bus 40. These check bits are stored in the memory array with the 16 data bits already on the internal data bus 40 from which the check bits were generated.

Referring to FIG. 3, in the read mode the CPU 10 generates control signals on the control bus 36 and address signals on an address bus 62 to cause the memory array to retrieve a selected one of the plurality of 21 bit encoded data words stored in the memory array 12. Referring again to FIG. 5, these 21 bits are latched into one of the four internal 21 bit latches 64, 66, 68, or 70 depending upon whether the data was retrieved from segment 24, 26, 28 or 30 of the memory array. These 21 data bits of the encoded data word, consisting of 16 data bits and the associated 5 check bits, are presented on the internal data bus 40 by the latch 36 at the input of the ECC generator 42. The ECC generator 42 utilizing internal gates to implement equation (8), generates five syndrome bits forming a syndrome pattern which is presented at the input of error decoder 48 via the ECC output bus 45.

The error decoder 48 decodes the syndrome bits and determines the existence and location of all single bit errors and the existence of certain double bit errors. From these syndrome bits, the error decoder 48 generates an address signal on one of its 21 output line comprising output bus 54 indicating which, if any, bit is in error. If no error has occurred, the error decoder 48 activates the $\overline{\text{NOERR}}$ output line. If a double error has occurred and the syndrome pattern generated is one of the 10 unused syndrome patterns, then one output line of bus 50 coupled to NAND gate 52 is activated thereby activating the DES output signal.

The correction circuitry 56 receives the address signals from the error decoder 48 on the bus 54 and the uncorrected data on the internal data bus 40, via input 41, and corrects the data by reversing the logic state of the bit in error. The corrected data is then output on the bus 58 and latched into the latch 60 for presentation to the internal data bus 40. The driver/latch 32 then drives the data bus 20 with the corrected data.

Figure 6:
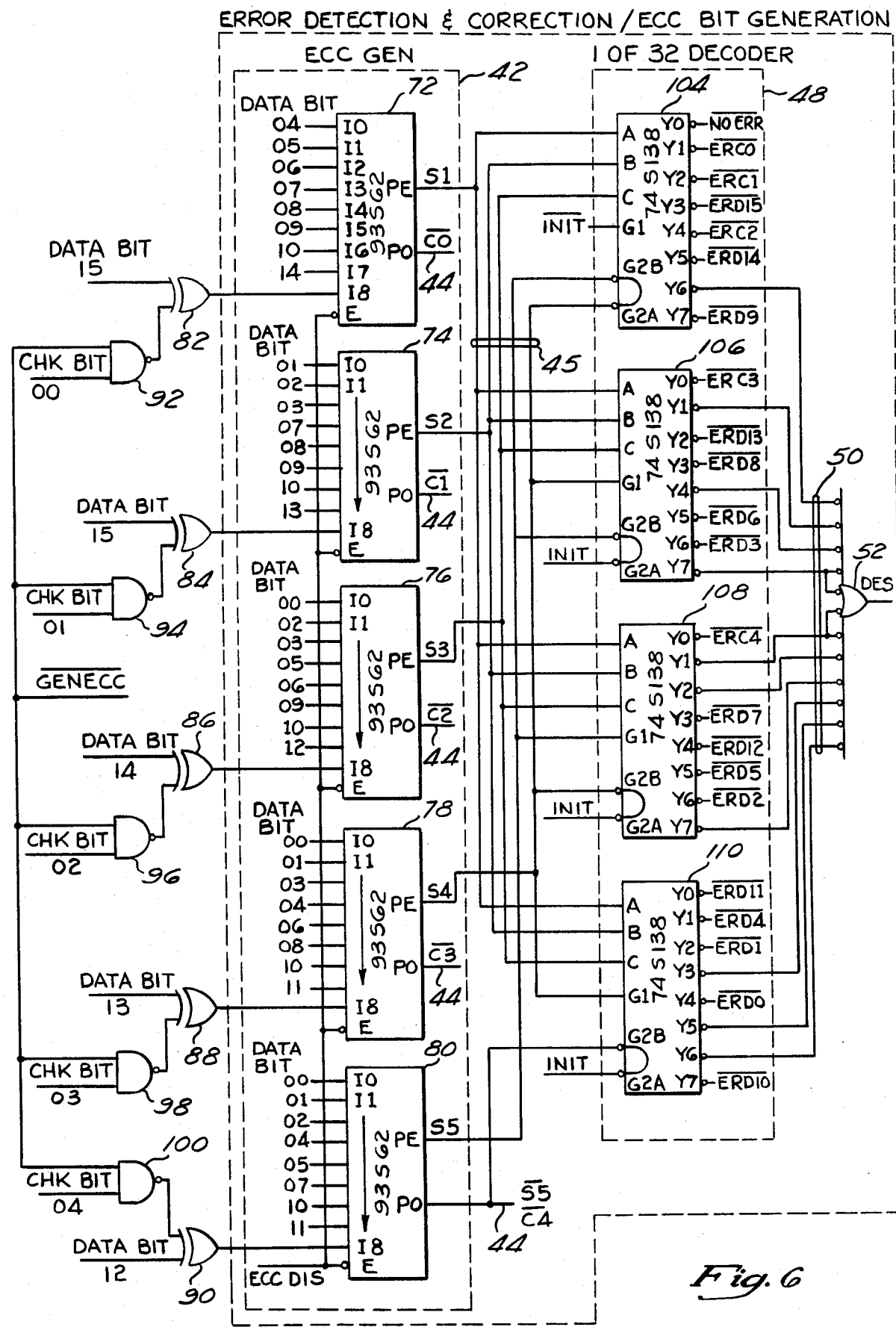
FIG. 6 is a block diagram of the error detection and correction apparatus in the memory.

Referring to FIG. 6, a more detailed diagram of part of the ECC system 18 is shown. The ECC generator 42 includes five parity generators 72, 74, 76, 78, and 80 which, in the preferred embodiment, are Fairchild 93S62 9-bit odd/even parity generators/checkers. Each of the five parity generator/checkers has its inputs coupled to a unique combination of data bits corresponding to the rows of the parity check matrix shown in FIG. 4. For example, parity generator 72 has its inputs coupled to data bits 4, 5, 6, 7, 8, 9, 10, 14, and 15. These data bits correspond to the position of all the logic 1's in the S1 row of the parity check matrix of FIG. 4. Likewise, parity generator 74 has its inputs coupled to all the data bits corresponding to the positions of the logic 1's in the S2 row of FIG. 4, i.e., bits 1, 2, 3, 7, 8, 9, 10, 13, and 15. Parity generator 76 has its inputs coupled to the data bits corresponding to row S3, i.e., bits 0, 2, 3, 5, 6, 9, 10, 12, and 14. Parity generator 78 has its inputs coupled to data bits 0, 1, 3, 4, 6, 8, 10, 11, and 13 which correspond to row S4 in FIG. 4. Finally, parity generator 80 has its inputs coupled to data bits 0, 1, 2, 4, 5, 7, 10, 11, and 12 which correspond to row S5 in FIG. 4.

There is a gating network coupled to the $I_8$ input of each of the parity generators 72, 74, 76, 78, and 80 to make the proper combination of data and check bits per equations (7) and (8) during the read and write modes. Exclusive-OR gates 82, 84, 86, 88 and 90 each have their outputs coupled to the $I_8$ inputs of parity generators 72, 74, 76, 78, and 80 respectively. One input of each of these exclusive-OR gates 82, 84, 86, 88 and 90 is coupled to the output of NAND gates 92, 94, 96, 98 and 100 respectively. One input of each of the NAND gates 92, 94, 96, 98, and 100 is coupled to the $\overline{\text{GENECC}}$ signal. The other inputs of exclusive-OR gates 82, 84, 86, 88, and 90 are coupled respectively to data bits 15, 15, 14, 13, and 12. The other inputs of NAND gates 92, 94, 96, 98, and 100 are coupled respectively to check bits 0, 1, 2, 3 and 4.

In the write mode ECC generator 42 is functioning to generate check bits 0-4 in accordance with equation (7). The signal $\overline{\text{GENECC}}$ is always low in the write mode which causes NAND gates 92, 94, 96, 98 and 100 to prevent check bits 0-4 from affecting the state of the NAND gate outputs. With $\overline{\text{GENECC}}$ low, the outputs of the NAND gates are high, and exclusive-OR gates 82, 84, 86, 88 and 90 are therefore serving as inverters to invert the data bits at the other inputs to the exclusive-OR gates as seen by inspection of an exclusive-OR gate truth table. Each parity generator 72, 74, 76, 78 and 80 internally implements equation (7) by performing an exclusive-OR logical operation of input $I_0$ against $I_1$, against $I_2$, against $I_3$ and so on until all 9 inputs $I_0$-$I_8$ have been exclusive-OR'd together. A signal $\overline{\text{ECCDIS}}$ controlled indirectly by the CPU 10 in FIG. 3 and coupled to the enable inputs E of the parity generators 72 through 80 serves to enable and disable the parity generators. Because the bits at the $I_8$ inputs of the parity generators are inverted, while the other data bits at inputs $I_0$-$I_7$ are not inverted, equation (7) will not be implemented unless the output of the parity generator is inverted since a string of exclusive-OR operations has the effect of counting whether there is an even or an odd number of logic 1's in the input data bits. That is, an exclusive-OR operation on nine 1's gives a logic 1, but an exclusive-OR operation performed on eight logic 1's and one logic 0 gives a logic zero. The nature of the exclusive-OR operation is such that an odd number of 1's exclusive-OR'd together yields a logic 1 output, but an even number of 1's gives a logic 0 output. The check bits being generated in the write mode are, by equation (7), the univerted exclusive-OR combinations of the nine data bits, and the PO or parity odd, output of the parity generators represents the logical function of the equation (7) uninverted because of the internal structure of the parity generators 72 through 80. Thus, the output bits $\overline{C0}$, $\overline{C1}$, $\overline{C2}$, $\overline{C3}$, and $\overline{C4}$ represent the inverted check bits. This result follows from the inversion of the data bits at the $I_8$ inputs. Accordingly, inverter 46 in FIG. 5 to which outputs $\overline{C0}$, $\overline{C1}$, $\overline{C2}$, $\overline{C3}$ and $\overline{C4}$ are coupled by bus 44 converts the check bits to their correct logical state for storage with the generating data bits.

In the read mode, the ECC generator 42 in FIG. 6 performs the logical operations represented by equation (8). The $\overline{\text{GENECC}}$ signal is high in the read mode which causes NAND gates 92, 94, 96, 98, and 100 to gate check bits 0-4 through to the input of the exclusive-OR gates 82, 84, 86, 88, and 90. The gates 82, 84, 86, 88, and 90 then perform the exclusive-OR operation on the data and check bits at their inputs in accordance with the last terms of equation (8), i.e., ($D_{15}$) X-OR ($C_0$), ($D_{15}$) X-OR ($C_1$), ($D_{14}$) X-OR ($C_2$), ($D_{13}$) X-OR ($C_3$) and ($D_{12}$) X-OR ($C_4$). The resultant data are coupled to the $I_8$ inputs of the parity generators 72, 74, 76, 78, and 80 where they are combined with the other data bits at the inputs to the parity generators. Exclusive-OR logic operations are performed in these parity generators to complete the generation of syndrome bits by the logical expressions of equation (8). However, because the signal $\overline{\text{GENECC}}$ is high in the read mode, the check bits are inverted in passing through the NAND gates 92, 94, 96, 98, and 100 which in turn inverts the resultant data at the outputs of the exclusive-OR gates 82, 84, 86, 88, and 90. Thus, the syndrome bits generated by the parity generators will be inverted because of the inversion of one term in the input. For this reason, the syndrome bits are taken from the parity even outputs, PE, of the parity generators 72, 74, 76, 78, and 80. The logical expression for the output at PE is $=(\overline{I_0})$ X-OR ($I_1$) X-OR ($I_2$) X-OR ($I_3$) X-OR ($I_4$) X-OR ($I_5$) X-OR ($I_6$) X-OR ($I_7$) X-OR ($I_8$), i.e., the same logical expression as present at the PO output but inverted.

After the syndrome bits S1-S5 are generated, they must be decoded to determine if an error exists. To accomplish this syndrome bits are coupled to the decoder 48 by the ECC bus 45. In the preferred embodiment the decoder 48 is comprised of four high speed TTL decoders of the 74S138 type as described in the Texas Instruments TTL data book 2d ed., page 7-134, 135 which is incorporated herein by reference. Referring to FIG. 6, these type decoders have two enable inputs G1 and G2 where G2=G2A or G2B, i.e., a logical OR operation is performed between G2A and G2b. They also have three select inputs A, B, and C and eight outputs, Y0 through Y7. A decoder 104 has its A, B, and C inputs coupled to the S1, S2, and S3 syndrome bits at the PE outputs of parity generators 72, 74, and 76. The decoder also has its G1 input coupled to an $\overline{\text{INIT}}$ signal and its G2B enable input is coupled to the S5 syndrome bit at the PE output of the parity generator 80. The G2A input is coupled to the S4 syndrome bit at the PE output of the parity generator 78. The decoder 104 has seven of its outputs Y1, Y2, Y3, Y4, Y5, Y7 and Y0 coupled to the correction circuit 56 shown in FIG. 6A to indicate the presence and location of a single bit error or the no error condition. The remaining output, Y6, is coupled to 10 input NOR gate 52 by one line of the 10 line bus 50. The other seven outputs and their significance are respectively: $\overline{\text{NOERR}}$=no error; $\overline{\text{ERC0}}$=error in check bit 0; $\overline{\text{ERC1}}$=error in check bit 1; $\overline{\text{ERD15}}$=error in data bit 15; $\overline{\text{ERC2}}$=error in check bit 2; $\overline{\text{ERD14}}$=error in data bit 14; and $\overline{\text{ERD9}}$=error in data bit 9. These error positions correspond to all those columns in the parity check matrix of FIG. 4 wherein the syndrome bits S4 and S5 are both zero. The truth table of the decoder 104 is such that when the G1 input is high and both the G2A and G2B inputs are low, the decoder decodes the data at its A, B, and C inputs such that the output goes low which corresponds to the decimal equivalent of the three-bit binary number at the A, B, and C inputs. Thus, decoder 104 will decode the S1, S2, and S3 syndrome bits into their decimal equivalent. For example, the Y7 output, $\overline{\text{ERD9}}$ will be low when the S1, S2, and S3 inputs are all high as seen in FIG. 4 and from inspection of the truth table for the 74S138 type decoder. When $\overline{\text{ERD9}}$ goes low, the correction circuitry S6, in FIG. 6A changes the logical state of data bit D9 thereby causing it to revert to tis original value. Likewise, when S1 and S3 are high but S2 is low, the Y5 output for the signal $\overline{\text{ERD14}}$ goes low as indicated by inspection of the parity check matrix of FIG. 4 and the truth table for decoder 104. The output Y0 goes low when the S1, S2, and S3 inputs are all low indicating no error has occurred. The signal $\overline{\text{INIT}}$ is a control signal which disables the decoder for approximately 2 seconds after initial system power up. The Y6 output corresponds to one of the unused input patterns which are in excess of the 21 needed patterns. There unused patterns are used to detect double bit errors.

The other decoders 106, 108 and 110 function similarly. The decoder 106 has its A input coupled to the S1 syndrome bit from parity generator 72, and its B and C inputs coupled respectively to the S2 and S3 syndrome bits from parity generators 74 and 76, respectively. The G1 input and a G2B input of the decoder 106 are coupled respectively to the S4 and S5 syndrome bit outputs of the parity generators 78 and 80 respectively; a G2A input is coupled to a control signal INIT. These input connections correspond to all the syndrome patterns in the parity check matrix of FIG. 4 wherein S4 is high and S5 is low. These syndrome patterns correspond by inspection of FIG. 2 to single bit errors at the check bit 3 or data bits 13, 8, 6, or 3. Accordingly, from the truth table for decoder 106, the Y0 output carries the signal $\overline{\text{ERC3}}$ indicating an error in check bit 3; likewise the Y2 output carries the $\overline{\text{ERD13}}$ signal; Y3 carries the $\overline{\text{ERD8}}$ signal; Y5 carries the $\overline{\text{ERD6}}$ signal; and Y6 carries the $\overline{\text{ERD3}}$ signal indicating errors in the positions of data bits 13, 8, 6, and 3, respectively. These outputs are coupled to the correction circuit 56 in FIG. 6A. The Y1, Y4, and Y7 outputs are coupled to the NAND gate 52 to indicate the presence of a detectable double error.

A decoder 108 has A, B, and C inputs coupled resectively to the S1, S2, and S3 syndrome bit outputs from parity generators 72, 74, and 76, respectively. A G1 input of decoder 108 is coupled to the S5 syndrome bit output of parity generator 80, and a G2B input is coupled to the S4 syndrome bit output of parity generator 78. The decoder 108 has its Y0, Y3, Y4, Y5, and Y6 outputs coupled to correction circuitry 56 in FIG. 6A for carrying signals indicating the presence of single bit errors at the check bit 4, or data bits 1, 7, 12 or 2 positions, respectively. Outputs Y1, Y2 and Y7 of decoder 108 are coupled to NAND gate 52 to indicate the presence of some but not all double bit errors. A G2A input is coupled to the INIT signal. The decoder 108 outputs coupled to the correction circuitry correspond to all those syndrome bit patterns in the parity check matrix of FIG. 4 where the S5 syndrome bit is high and the S4 bit is low.

A decoder 110 has its A, B, and C inputs coupled to the S1, S2, and S3 syndrome bit outputs of parity generators 72, 74 and 76 respectively. A G1 input is coupled to the S4 syndrome bit output of parity generator 78 and a G2B input is coupled to the $\overline{\text{S5}}$ output, P0, of parity generator 80. A G2A input is coupled to the control signal INIT. Outputs Y0, Y1, Y2, Y4 and Y7 of decoder 110 are coupled to the correction circuit 52 of FIG. 6A to carry signals indicating single bit errors at the locations of data bit 11 or 4 or 1 or 0 or 10 respectively. Outputs Y3, Y5, and Y6 are coupled to the inputs of NAND gate 52 to carry signals indicating the presence of a detectable double error.

Figure 6A:
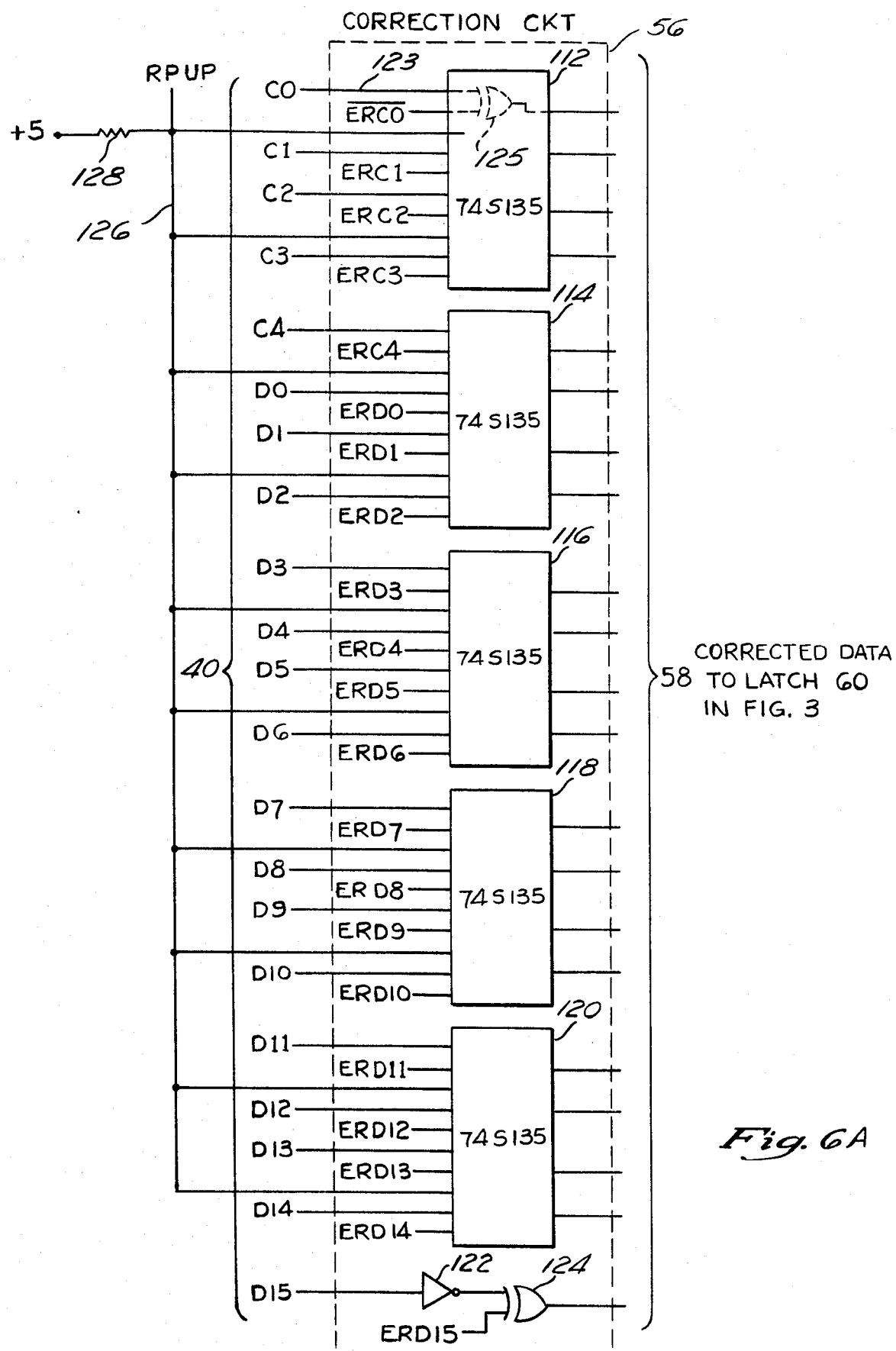
FIG. 6A is a block diagram of a correction circuit.

The correction circuit 56 in FIG. 5 is shown in more detail in FIG. 6A. In the preferred embodiment, the correction circuit 56 is comprised of five quad exclusive-OR/NOR gates of the 74S135 type. This type gate is described at page 7-129 of the above-identified Texas Instruments TTL Data Book which is incorporated herein by reference. These exclusive-OR gate chips 112, 114, 116, 118, and 120 will serve to change erroneous bits on the internal data bus 40 from one logical state to the opposite logical state if the error correction signal from the error decoder 48 in FIG. 6 corresponding to a particular bit position on the internal data bus indicates that that bit is in error. Accordingly, quad gate chip 112 has four data inputs coupled to the internal bus 40. These four data inputs each are coupled internally to one input of an internal exclusive-OR gate. Each of these exclusive-OR gates has another data input coupled externally to the error correction signal from decoder 48 which corresponds in significance to the data bit on the other input. For example, line 123 is coupled to check bit zero of internal data bus 40 and is internally coupled to one exclusive-OR gate 125 within quad gate chip 112. This exclusive-OR gate 125 is shown schematically drawn within the boundaries of quad gate chip 112. The other input for the exclusive-OR gate 125 is coupled to the error signal $\overline{\text{ERC0}}$ from decoder 104 in FIG. 6. Similar connections are made for all the check bits C0 through C4 and data bits D0 through D14. i.e., each is paired with the corresponding error signal from one of the decoder chips of decoder 48 of FIG. 6. A separate inverter 122 has its input coupled to the D15 line carrying data bit 15 on the internal data bus. The output of the inverter 122 is coupled to one input of a separate exclusive-OR gate 124, the other input of which is coupled to the signal $\overline{\text{ERD15}}$ from decoder 48 in FIG. 6. The output of the exclusive-OR gate 124 forms a part of bus 58 to latch 60 in FIG. 5.

The control signal RPUP on line 126 is a control signal coupled to the control terminals of each of quad gate chips 112, 114, 116, 118 and 120. Line 126 is normally held high by virtue of its coupling to a positive five-volt supply source through a resistor 128. With line 126 in the logic high state, the quad gate chips are functioning in the exclusive-NOR mode. In this mode, if a particular data or check bit is supposed to be a 0 but is, in fact, a 1, and the corresponding error signal from the decoder goes low indicating that the bit is in error, then the output from an exclusive-NOR gate will be low, thereby changing the condition of the erroneous bit from the erroneous logic 1 level to the correct logic 0 level. After the corrected data is latched into latch 60 in FIG. 5, it can be driven onto the internal data bus 40 for reading by the CPU 10.

Turning now to FIG. 7, there is shown the sequence of steps followed by the central processing unit 10 in checking the correct operation of the ECC system 18 in the memory. In the preferred embodiment, the sequence of steps followed in performing this function is controlled by computer instructions stored in non-volatile memory in the CPU such as ROM or PROM. The preferred embodiment includes utilization of the general purpose logic circuitry within the CPU 10 to perform the operations called for by the instructions stored in the non-volatile memory. Since the exact internal architecture of the CPU is not critical to the correct operation of this ECC spot check system 22 in FIG. 3 no specific drawings of the CPU hardware utilized in carrying out the functions detailed in FIG. 7 are given. It will be apparent to those skilled in the art that any conventional CPU architecture will suffice for purposes of the invention.

The invention includes performing the steps detailed in FIG. 7 on a spot check basis to check the correct operation of a self-correcting memory similar to the self-correcting memory described above. It is not critical to the invention that the self-correcting memory function exactly as detailed in the description of the exemplary self-correcting memory shown in FIGS. 5, 6 and 6A. Any self-correcting memories which use the error correction code algorithm for generating and storing check bits described herein will perform satisfactorily. The description of FIGS. 5, 6, and 6A herein is intended to describe the preferred memory structure for use with the ECC spot check system 22 in the CPU 10 of FIG. 3. The invention however, resides in the combination of the ECC spot check system 22 with a self-correcting memory to ensure greater system integrity.

The invention is also not restricted to the disclosed algorithm. Any algorithm can be used which, when incorporated into hardware logic, generates enough check bits to detect single bit errors in the memory. The particular parity check matrix of FIG. 4 and the particular algorithm illustrated in FIG. 7 are described only as the best mode of practicing the invention because the algorithm so embodied maximizes the fraction of all possible double bit errors which are detected by the system. Any other parity check matrix sufficient for purposes of detecting and locating all single bit errors will be sufficient. The invention is in the broad concept of utilizing the hardware of the CPU to follow a predetermined series of steps to generate a new set of check bits for purposes of comparing the newly generated check bits to the check bits generated by the error correction system in the memory and for signaling when the newly generated check bits are not identical to the check bits stored in the memory. When such a condition occurs, the loss of system integrity is indicated and the CPU will be stopped.

Specifically, the ECC spot check system 22 in FIG. 3 serves to check the correct operation of the ECC bit generation and error correcting hardware 18 in memory 12. This spot check occurs upon receipt of a predetermined signal which can be any random or recurrent signal which occurs during operations of the central processing unit 10. The ECC spot check system performs its check by independently generating new check bits from the data word being retrieved at the time the spot check signal occurs. These check bits are generated in the CPU in seriatim fashion as opposed to the parallel fashion in which the check bits generated in the memory 12. The instructions can be arranged into functional groups, the description of which follows.

Referring to FIGS. 3 and 7, the first functional group initializes the CPU 10 to perform the check bit generation. The CPU has a number of temporary storage registers or working registers used as scratchpad memory in performing the various operations called for by the applications program. The contents of one of these registers, the W register, must be saved since the W register will be used by the ECC spot check system. The first group of instructions causes the CPU to set a first temporary memory location to a default value syndrome binary bit pattern of all logic ones. The functional block performing this operation in FIG. 7 is designated 130 and the notation indicating this operation is = : 1F to TØ2. This notation means that a fixed or constant binary value represented by the hexadecimal number 1F is to be stored in temporary storage location TØ2 where = means "what follows is a constant" and ":" means "the following number is in hexadecimal notation". In hexadecimal notation (hereinafter "hex"), 1F means 11111 in binary. This group of five ones is the starting or default syndrome bit pattern. Later operations will work on each bit and either leave it as a logic one or change it to logic zero depending upon the results of parity testing performed on various combinations of the data bits in the word retrieved from the semiconductor memory 12. Block 130 also performs the function of starting the read operation for retrieving and storing in a temporary storage location the check bits stored in the semiconductor memory. The check bits retrieved are those associated with the data word being retrieved from the memory at the time of occurrence of the random spot check signal. That is, upon the occurrence of the spot check signal, whatever data word that is being retrieved from memory, or the next data word accessed, will have its associated check bits brought into the CPU and stored. This operation is for the purpose of later comparison with the check bits generated by the CPU from the data word as corrected by the hardware in the memory. The data word, as corrected and received at the CPU, will be stored in temporary storage location 03 by virtue of normal operation of the CPU 10 upon a memory read operation. In the preferred embodiment, the predetermined signal which causes the ECC spot check is rollover of an event counter which counts any event such as interrupt requests encountered in the operation of the computer. Generally, the spot check is performed every 45 seconds on the average. In other embodiments, the spot check can be performed totally randomly or periodically. The notation in block 130 designating this retrieval of the ECC bits from the memory is RECC.

The first functional group also sets a failure flag at the initial state of logic one and saves the contents of a working register W in the CPU 10 by moving it to temporary storage location 04 until the operation of the ECC spot check system 22 is complete. Block 132 in FIG. 7 performs these functions, the notation for the saving operation being "W to TØ4" and the notation for the flag setting operation being "1 to CL3" where CL3 is the failure flag and TØ4 is a temporary storage location.

A second functional group of instructions causes the hardware of the CPU 10 to generate the first syndrome bit from the corrected data brought in from the memory 12. This second functional group is comprised of three subgroups. The first subgroup causes the CPU hardware to act as a bit mask circuit to mask off all but one predetermined subset of the data bits in the retrieved data word as corrected. There is a group of instructions similar in function to this second functional group for each of the five syndrome bits to be generated. Each has a similar first subgroups but each first subgroup differs from all the others in that each first subgroups masks off a different subset than any of the others. Each functional group for generation of a syndrome bit also has similar second and third subgroups of instructions as will be described below.

The first subgroup in the second functional group is designated in FIG. 7 as block 134. Block 134 performs an AND logical operation between the incoming corrected data word from memory and a binary bit mask pattern to form the predetermined subset of data bits from the data word. The first subgroup utilizes as the bit mask the binary bit pattern represented by the hex notation 1CB7. In binary, the hex notation 1CB7 corresponds to the binary bit pattern in the S5 row of the parity check matrix of FIG. 4 where DØ is the least significant bit and D15 is the most significant bit. That is, the first four bits D0-D3, being 1110 in binary, represent the number 7 in nex. The next four bits D4-D7, being 1101 in binary, represent the number B in hex notation and so on for all 16 bits. The notation in block 134 which represents this operation is, T03AND=:1CB7, which means the contents of temporary storage location T03 are ANDed, which AND operation is represented by an upside down V, with the constant 1CB7 in hex notation.

The second subgroup in the second functional groups causes the CPU to perform a parity test on the group of bits output from the bit mask operation represented by block 134. That is, all logic 1's in the incoming data word which correspond to the position of logic 0's in the bit mask pattern are output as logic 0's. However, all locations in the incoming data word that correspond to the positions of logic 1's in the bit mask patterns are output from bit mask circuitry as logic 0's if the data bit is a 0 and as logic 1's if the data bit is a logic 1. The second subgroup causes the CPU hardware to test the number of logic 1's in the resultant bit pattern from the bit mask circuitry represented by block 134. The notation for this operation represented by block 136 in FIG. 7 is RPAROD. If the number of logic 1's in the bit pattern is even, then the parity testing circuitry causes a first type logical operation to be performed and, if the number of logic 1's is odd, a second type logical operation is performed. The first type logical operation is an exclusive-OR operation performed by the third subgroup as described below on the default pattern of syndrome bits. The second type logical operation is a bit masking operation performed by the CPU hardware in carrying out the first subgroup of instructions in the third functional group, i.e., the operation represented by block 140, as described more fully below.

The third subgroup of instructions of the second functional group is represented by block 138 and causes the CPU hardware to set or reset a first syndrome bit. This function is performed when the results of the parity test represented by block 136 are even, as schematically represented by the "no" line coupling parity test block 136 to syndrome bit setting block 138. Syndrome bit setting block 138 performs an exclusive-OR operation between the contents of temporary storage register 02 and the binary bit pattern represented by the hexadecimal number 10 and replaces the contents of the TØ2 register with the result. Temporary storage register 02 contains the default syndrome bit patterns of all logic 1's prior to this exclusive-OR operation and contains the bit pattern 01111 after the operation where the 0 represents syndrome bit S5. The notation in block 138 which represents this logical operation is T01XOR=:10 to T02, which means the contents of temporary storage register T02 are exclusive-ORed with the constant binary pattern represented by hex 10, the result being stored in temporary storage register 02. The exclusive-OR operation is represented by an upright V with a semicircle drawn through it.

If the parity test represented by block 136 results in a count of an odd number of logic 1's in the subset of bits from the bit mask circuitry represented by bit masking block 134, then a second type logical operation in the form of a second bit masking operation must be performed. This relationship is represented by the "yes" line between parity test block 136 and bit masking block 140 in FIG. 7. Bit masking block 140 will also perform its function upon completion of the operation represented by block 138 as indicated by line 139. That is, block 140 represents the operation which is performed upon completion of either the operation performed by block 138 or upon an odd result from the parity test represented by block 136. The identical situation exists in the third, fourth, fifth, and sixth functional groups which generate the last four syndrome bits S1-S4.

Bit masking block 140 functions similarly to bit mask block 134 in that the incoming data word stored in temporary storage register TO3, which is unchanged by the operations of the second functional groups described above, is ANDed with a binary bit pattern so as to extract a different subset of bits. In bit mask 140, however, the bit mask pattern is represented as 2D5B in hex notation. This bit pattern represents the bits in the S4 row of the parity check matrix of FIG. 4 with data bits 0-3, i.e., 1101, representing hex B. This subset is different than all the other rows in the parity check matrix.

The parity test represented by block 142 is similar to that represented by block 136.

If the results of the parity test on the second subset of bits is even, then, as in the second functional group, block 144 resets the S4 syndrome bit, i.e., sets it to logic 0, in temporary storage location 02 by performing an exclusive-OR logical operation between the contents of T02 and hex 8 and storing the result in T02. This relationship is represented by the "NO" line connecting parity test block 142 to block 144.

If the results of the parity test represented by block 142 are odd, or upon completion of the operation represented by block 144, then a third bit masking logical AND operation is performed as represented by block 146 and the "YES" line connecting block 142 to block 146 and by line 145. The bit mask pattern used by block 146 is represented by hex 566D, but in all other respects, the function performed is similar to the function represented by blocks 140 and 134. Hex 566D represents the bit pattern of syndrome bits S3 in FIG. 4.

Parity test block 148 tests the number of logic ones in the resultant bit pattern from the bit mask circuit represented by block 146 in a fashion similar in all respects to blocks 136 and 142.

If the results of the parity test are even, syndrome bit setting block 150 resets the S3 syndrome bit in temporary storage register T02. This is done by performing an exclusive-OR operation on the contents of T02 with hex 04 and replacing the contents of T02 with the result. The relationship between blocks 148 and 150 is represented by the "NO" line between these blocks.

If the results of the parity test represented by block 148 are odd or upon completion of the operation represented by block 150, then a fourth bit masking logical AND operation is performed as represented by block 152 and the "YES" line connecting block 148 and 152 and by line 151. The bit mask pattern used by block 152 is represented by hex A78E, but in all other respects, the function performed by block 152 is similar to the function represented by bit mask blocks 134, 140, and 146. Hex A78E represents the binary bit pattern of syndrome bit S2 in FIG. 3.

Parity test block 154 tests the output of bit mask block 152 for even or odd parity in a fashion similar to test blocks 136, 142, and 148. If even parity is detected, the S2 syndrome bit is reset by syndrome bit setting block 156 as represented by the "NO" line coupling block 154 to block 156. Block 156 represents the instructions which cause the CPU 10 to perform an exclusive-OR operation upon the contents of temporary storage register T02 with hex 2 and replace the contents of location 02 with the result.

If odd parity is detected or upon completion of the operation represented by block 156, block 158 performs the bit masking operation necessary to derive the subset of data bits used in generating syndrome bit S1. This relationship between the circuitry represented by test block 154 and the circuitry represented by bit mask block 158 and block 156 is represented by the "YES" line between blocks 154 and 158 and line 157. Bit mask block 158 performs a logical AND operation between the incoming corrected data word in TØ3 and a binary bit pattern represented by hex C7FØ. This binary bit pattern C7FØ represents the pattern on the S1 row of the parity check matrix of FIG. 4.

The parity test circuitry represented by block 160 tests parity of the output bit pattern from bit mask circuitry 158 and causes the syndrome bit setting circuitry represented by block 162 to reset syndrome bit S1 if even parity is detected as represented by the "NO" line between blocks 160 and 163. Syndrome bit S1 is reset by performing an exclusive-OR operation on the contents of temporary storage location TØ2 with the result.

If odd parity is detected, then the generation of syndrone bits S1–S5 is complete. At this time, the CPU is ready to test, under the control of the 7th functional group, the check bits brought in from memory against the syndrome bits derived as described above. Block 130 in the first functional group started the access from memory 13 of the ECC check bits associated with the corrected data word used by the CPU 10 to generate the new syndrome bits as just described. These check bits are stored in the Z working register when they arrive. Block 164 represents the circuitry and instructions which transfer the check bits and data to the temporary storage register TØ5. This operation is commenced upon either the completion of operations by syndrome bit setting block 162 as represented by the "YES" line between blocks 160 and 164. If at the time of either of these events, the check bits being retrieved from memory 12 have not yet arrived in the Z register, then a waiting operation is established by the circuitry and instructions represented by block 164 until such time as the check bits and data arrive.

Because the access of the check bits by block 130 also brings in undesired unknown bits on the upper eleven lines because these lines are "floating", the floating lines must be forced to zero. This masking operation is represented by block 166. The block 166 performs a logical AND operation between the contents of TØ5 and the constant binary bit pattern represented by hex 1F. The effect of this operation is to force all bits but the five check bits in the five least significant digits to zero. These check bits are then stored in working register W. The notation representing this operation is, TØ5AND=:1F to W.

The comparison circuitry represented by block 168 serves to compare the check bits retrieved from the memory 12 to the syndrome bits derived by the CPU. This comparison is accomplished by performing a logical exclusive-OR operation between the retrieved check bits stored in the W working register and the generated syndrome bits stored in temporary storage register TØ2. A test block 170 tests the output data from the exclusive-OR comparison block to determine whether the result is zero and signals the results of the test either on the "YES" line or the "NO" line.

If the check bits and the syndrome bits are the same, an exclusive-OR operation between the two data sets will result in an all zero data set; this condition indicates that the system has passed the memory integrity test. As indicated by the "YES" line from block 170, the circuitry represented by block 172 then restores the original contents of the W working register and clears the failure flag CL3 to logic zero. If the test represented by block 170 gave a non-zero result, represented by the "NO" line from block 170, then block 174 would restore the original contents of the W working register and leave the failure flag CL3 set. In either event, after the operations of blocks 172 and 174 are completed, control of the CPU is returned to the calling subroutine to continue operations.

At some random time when a random event counter in the CPU signals for a check of the failure flag CL3, the status of the flag will be read. If the flag is set, circuitry in the CPU under the control of instructions for checking the failure flag will cause all processing operations in the CPU to stop.

The invention has been described in terms of a schematic representation of the operations to be performed because the actual circuitry to perform the operations is apparent to those skilled in the art and is not critical to the invention. In the preferred embodiment, the circuitry of the "Naked Mini" computer, manufactured by Computer Automation, Inc. in Irvine, Calif., as of the filing date hereof, is used, and the instructions embodying the algorithm used in the ECC spot check system 22 are stored in the machine micro code language of the "Naked Mini". The details of the structure of the CPU of the "Naked Mini" as described in various publications and patents of Computer Automation, Inc. are hereby incorporated by reference.

Other languages and computer structures will work also as, for example, the Intel 8080 microprocessor and associated ROM and RAM memory with error correction capability. Such a microprocessor is described in depth in Microprocessor Systems Engineering by R. C. Camp, T. A. Smay, and C. J. Triska, Matrix Publishers, Inc., Portland, Oreg. (1979), Library of Congress Catalog Card Number 79-88573. Any of the other microprocessors described in that reference will work equally as well, and the reference is expressly incorporated herein by reference. The particular instructions which are used in the preferred embodiment are included herewith as Appendix I. Further, it will be recognized by those skilled in the art that a dedicated logic circuit could be devised in hardware to perform the functions of the ECC spot check system 22 described herein.

Although the invention has been described in terms of the preferred embodiment described herein, it will be apparent to those skilled in the art that numerous modifications are possible without departing from the spirit and scope of the invention. For example, a dedicated hardware system could be designed for the CPU to accomplish the functions of the firmware of the spot check system. Such modifications are intended to be included within the scope of the claims appended hereto.

| | APPENDIX I | | | |
|---|---|---|---|---|
| Address | | | Instruction | |
| 3149 | | * | | |
| 3150 | 0007 | MEMV | CPYB | = :1F,TO,TO2 |
| 3151 | 0002 | | CONT | RECC |

-continued
APPENDIX I

| Address | | | | Instruction | |
|---|---|---|---|---|---|
| 3152 | 050B | 5AAB | EM | | Label 130 Group 1 |
| 3152+ | 050B | B800 | | | |
| 3152+ | 050B | 1480 | | | |
| 3152+ | 050B | 20E0 | | | |
| 3153 | | 0007 | | CPYB | WREG,TO,TO4 |
| 3154 | | 0002 | | CONT | SCL3 |
| 3155 | 050C | 5AC8 | EM | | Label 132 Group 1 |
| 3155+ | 050C | 3800 | | | |
| 3155+ | 050C | 3600 | | | |
| 3155+ | 050C | 5A86 | | | |
| 3156 | | 0400 | | COMP | TO3,AND=:1CB7 |
| 3157 | | 050E | | JOC | RPAROD,MEMV1 |
| 3158 | 050D | 1AB3 | EM | | Label 134 & 136 Group 2 |
| 3158+ | 050D | B800 | | | |
| 3158+ | 050D | F280 | | | |
| 3158+ | 050D | E348 | | | |
| 3159 | | 0400 | MEMV1 | COMP | TO2,XOR,=:10 |
| 3160 | | 0002 | | TO | TO2 |
| 3161 | 050E | 6AAB | EM | | Label 138 Group 2 |
| 3161+ | 050E | B800 | | | |
| 3161+ | 050E | 3400 | | | |
| 3161+ | 050E | 00EF | | | |
| 3162 | | 0400 | | COMP | TO3,AND,=:2D5B |
| 3163 | | 0510 | | JOC | RPAROD,MEMV2 |
| 3164 | 050F | 1AB3 | EM | | Label 140 & 142 Group 3 |
| 3164+ | 050F | B800 | | | |
| 3164+ | 050F | F280 | | | |
| 3164+ | 050F | D2A4 | | | |
| 3165 | | 0400 | MEMV2 | COMP | TO2,XOR,=:8 |
| 3166 | | 0002 | | TO | TO2 |
| 3167 | 0510 | 6AAB | EM | | Label 144 Group 3 |
| 3167+ | 0510 | B800 | | | |
| 3167+ | 0510 | 3400 | | | |
| 3168 | | 0400 | | COMP | TO3,AND.=:,566D |
| 2169 | | 0512 | | JOC | RPAROD,MEMV3 |
| 3170 | 0511 | 1AB3 | EM | | Label.146 & 148 Group 4 |
| 3170+ | 0511 | B800 | | | |
| 3170+ | 0511 | F280 | | | |
| 3170+ | 0511 | A992 | | | |
| 3171 | | 0400 | MEMV3 | COMP | TO2,XOR,=:4 Label 150-Group 4 |
| 3172 | | 0002 | | TO | TO2 |
| 3173 | 0512 | 6AAB | EM | | Label 150 Group 4 (Cont'd) |
| 3173+ | 0512 | B800 | | | |
| 3173+ | 0512 | 3400 | | | |
| 3173+ | 0512 | 00FB | | | |
| 3174 | | 0400 | | COMP | TO3,AND,=:A78E |
| 3175 | | 0514 | | JOC | RPAROD,MEMV4 |
| 3176 | 0513 | 1AB3 | EM | | Label 152 & 154 Group 5 |
| 3176+ | 0513 | B800 | | | |
| 3176+ | 0513 | F280 | | | |
| 3176+ | 0513 | 5871 | | | |
| 3177 | | 0400 | MEMV4 | COMP | TO2,XOR,=:2 |
| 3178 | | 0002 | | TO | TO2 |
| 3179 | 0514 | 6AAB | EM | | Label 156 Group 5 |
| 3179+ | 0514 | B800 | | | |
| 3179+ | 0514 | 3400 | | | |
| 3179+ | 0514 | 00FD | | | |
| 3180 | | 0400 | | COMP | TO3,AND,=:C7F0 |
| 3181 | | 0516 | | JOC | RPAROD,MEMV5 |
| 3182 | 0515 | 1AB3 | EM | | Label 158 & 160 Group 6 |
| 3182+ | 0515 | B800 | | | |
| 3182+ | 0515 | F280 | | | |
| 3182+ | 0515 | 380F | | | |
| 3183 | | 0400 | MEMV5 | COMP | TO2,XOR,=:1 |
| 3184 | | 0002 | | TO | TO2 |
| 3185 | 0516 | 6AAB | EM | | Label 162 Group 6 |
| 3185+ | 0516 | B800 | | | |
| 3186 | | 0007 | | CPYB | ZREG,TO,TO5 |
| 3187 | | 0003 | | CONT | RDB,WAT3 |
| 3188 | 0517 | 5AD9 | EM | | Label 164 Group 7 |
| 3188+ | 0517 | 3800 | | | |
| 3188+ | 0517 | 1440 | | | |
| 3188+ | 0517 | 128C | | | |
| 3189 | | 0400 | | COMP | TO5,AND,=:1F |
| 3190 | | 0002 | | TO | WREG |
| 3191 | 0518 | 1AD3 | EM | | Label 166 Group 7 |
| 3191+ | 0518 | BE00 | | | |

-continued
APPENDIX I

| Address | | | | Instruction | |
|---|---|---|---|---|---|
| 3191+ | 0518 | 3400 | | | |
| 3191+ | 0518 | 00E0 | | | |
| 3192 | | 0000 | | COMP | TO2,XOR,WREG |
| 3193 | | 051A | | JOC | RZERO,MEMV6 |
| 3194 | 0519 | 6AA0 | EM | | Label 168 & 170 Group 7 |
| 3194+ | 0519 | 3800 | | | |
| 3194+ | 0519 | 0400 | | | |
| 3194+ | 0519 | 028D | | | |
| 3195 | | 0007 | MEMV6 | CPYF | TO4,TO,WREG |
| 3196 | | 0000 | | RTN | |
| 3197 | 051A | 02C0 | EM | | Label 174 Group 7 |
| 3197+ | 051A | 0E00 | | | |
| 3197+ | 051A | AC00 | | | |
| 3197+ | 051A | 0000 | | | |
| 3198 | | 0007 | | CPYF | TO4,TO,WREG |
| 3199 | | 0002 | | CONT | RCL3 |
| 3200 | | 0000 | | RTN | Label 172 Group 7 |
| 3201 | 051B | 02C0 | EM | | |
| 3201+ | 051B | 0E00 | | | |
| 3201+ | 051B | AE00 | | | |
| 3201+ | 051B | 1800 | | | |
| 3202 | | 0007 | NSGNL2 | CPYF | P,TO,MREG |
| 3203 | | 0003 | | CONT | WAT3,RDBF |
| 3204 | | 0024 | | JOC | NOINTS,INTRPS |
| 3205 | 051C | 0210 | EM | | |
| 3205+ | 051C | 3980 | | | |
| 3205+ | 051C | C840 | | | |
| 3205+ | 051C | 0812 | | | |
| 3206 | | 0007 | | CPYB | MREG,TO,WREG. |
| 3207 | 051D | 5802 | EM | | ADRG |
| 3207+ | 051D | 3E60 | | | |
| 3207+ | 051D | 1400 | | | |
| 3207+ | 051D | 028F | | | |

I claim:

1. A memory for correcting stored data during refresh cycles including:
dynamic storage array means having data words stored in rows and columns of address locations, data inputs and outputs, address inputs, row address strobe inputs and column address strobe inputs, said storage array means for storing and retrieving data words at selected row and column addresses and for refreshing the data stored in a selected row at predetermined times and for receiving a selected data word from the row being refreshed during each refresh cycle and for correcting it and re-storing it at the same address and for presenting data at said data output from the address selected by signals at said address inputs;
an address bus for guiding memory address signals;
a clock;
refresh counter means coupled to said address inputs and to said clock for supplying sequential addresses to said address inputs during said refresh cycles;
means coupled to said address bus and coupled to said row address strobe inputs for supplying said row address strobe signals to said row address strobe inputs; and
means coupled to said address bus and coupled to said refresh counter means for supplying column address strobe signals to said column address strobe inputs.

2. An apparatus for error correcting during the refresh cycle of a dynamic memory comprising:
a dynamic memory having address inputs and data input and output, said memory for storing a plurality of data words;
means, coupled to said address inputs, for repeatedly refreshing said memory in a plurality of refresh cycles, and for selecting and correcting and re-storing a data word during at least some of said refresh cycles;

first row address driver means coupled to said address inputs of said dynamic memory for supplying row address signals to said memory during said refresh cycle;

first column address driver means coupled to said address inputs of said memory for supplying column address signals to said memory during said refresh cycle;

a clock means for generating pulses indicating the time boundaries of said refresh cycles;

a refresh counter means electrically connected to the clock means for counting said clock pulses and generating row and column address signals for coupling by said first row address and column address driver means to said memory during said refresh cycle;

an address bus electrically connectable to the column address driver, for guiding memory address signals;

second row address driver means coupled to said address inputs of said memory and for coupling to said address bus for driving said address inputs of said memory with signals from said address bus when said memory is not in a refresh cycle; and second column address driver means coupled to said address inputs of said memory and for coupling to said address bus for driving said address inputs of said memory with signals from said address bus when said memory is not in a refresh cycle.

3. An apparatus for error correcting during the refresh cycle of a memory as defined in claim 2 further comprising means, electrically connected to the selecting and correcting means, for signalling when said selecting and correcting means has found an error during a refresh cycle.

4. An apparatus for error correcting during the refresh cycle of a dynamic memory as defined in claim 2, further comprising:

a light source coupled to the selecting and correcting and re-storing means, so as to visually communicate to a user the detection of errors.

5. An apparatus for error correcting during the refresh cycle of a memory as defined in claim 1 further comprising:

means coupled to the light source for causing said light source to indicate to a user the rate at which errors are being detected.

6. An apparatus for error correcting during the refresh cycle of a memory comprising:

a dynamic memory having address inputs and data input and output, said memory divided into a plurality of segments, each segment for storing a plurality of data words in a plurality of rows and columns;

means, coupled to said address inputs, for repeatedly refreshing said memory in each said element during each of a plurality of refresh cycles, and for selecting and correcting and re-storing a data word from a selected one of said rows being refreshed during said refresh cycles;

first row address driver means coupled to said address inputs of said dynamic memory for supplying column address signals to said memory during said refresh cycle;

first column address driver means coupled to said address inputs of said memory for supplying column address signals to said memory during said refresh cycle;

a clock means for generating pulses indicating the time boundaries of said refresh cycles;

a refresh counter means electrically connected to the clock means for counting said clock pulses and generating row and column address signals for coupling by said first row address and column address driver means to said memory during said refresh cycle;

an address bus electrically connectable to the column address driver, for guiding memory address signals;

second row address driver means coupled to said address inputs of said memory and for coupling to said address bus for driving said address inputs of said memory with signals from said address bus when said memory is not in a refresh cycle; and second column address driver means coupled to said address inputs of said memory and for coupling to said address bus for driving said address inputs of said memory with signals from said address bus when said memory is not in a refresh cycle.

7. An apparatus as defined in claim 6 further comprising means, electrically connected to the selecting and correcting means, for signalling when said selecting and correcting means has found an error during a refresh cycle.

8. An apparatus for error correcting during the refresh cycle of a memory as defined in claim 6, further comprising:

a light source coupled to said selecting and correcting and re-storing means for visually indicating to a user the rate at which errors are detected.

9. An apparatus for error correcting during the refresh cycle of a memory including:

a dynamic memory having address inputs divided into a plurality of segments, each segment for storing a plurality of data words at a plurality of row and column addresses;

a cache memory coupled to said dynamic memory for receiving and storing a data word from each said segment of said memory when said data word is addressed and is not already stored in said cache memory;

refreshing means coupled to said dynamic memory for repeatedly refreshing one row in each said segment during each of a plurality of refresh cycles and for selecting and correcting and re-storing a data word from a selected one of said rows being refreshed during each said refresh cycle;

means for signalling when said selecting and correcting means has found an error during a refresh cycle;

first row address driver means coupled to said address inputs of said dynamic memory for supplying row address signals to said memory during said refresh cycle;

first column address driver means coupled to said address inputs of said memory for supplying column address signals to said memory during said refresh cycle;

a clock means for generating pulses indicating the time boundaries of said refresh cycles;

a refresh counter means, electrically connected to the selecting and correcting means, for counting said clock pulses and generating row and column address signals for coupling by said first row address and column address driver means to said memory during said refresh cycle;

an address bus electrically connectable to the column address driver for guiding memory address signals;

second row address driver means coupled to said address inputs of said memory and for coupling to said address bus for driving said address inputs of said memory with signals from said address bus when said memory is not in a refresh cycle; and second column address driver means coupled to said address inputs of said memory and for coupling to said address bus for driving said address inputs of said memory with signals from said address bus when said memory is not in a refresh cycle.

10. An apparatus for error correcting during the refresh cycle of a memory as defined in claim 9, further comprising:

a light source coupled to said refreshing means for visually indicating to a user that errors are being found.

11. An apparatus as defined in claim 2, 6 or 9 wherein said dynamic memory has a read mode, a write mode and a refresh cycle and is comprised of a plurality of segments and each said segment is comprised of a plurality of random access memory means each having address inputs and having a row address strobe input and a column address strobe input.

12. An apparatus as defined in claim 11 wherein said refreshing means includes:

decoder means coupled to selected bits from said address bus and said refresh counter means for decoding said selected bits into row address strobe and column address strobe signals; and multiplexing means coupled to said decoder means for coupling said row address strobe and column address strobe signals to selected ones of said row address strobe and column address strobe inputs of selected segments of said dynamic memory during each of said read mode, write mode and refresh cycles.

* * * * *